(12) United States Patent
Wang et al.

(10) Patent No.: US 12,230,204 B2
(45) Date of Patent: Feb. 18, 2025

(54) PIXEL CIRCUIT, DRIVING METHOD, AND DISPLAY DEVICE

(71) Applicant: BOE TECHNOLOGY GROUP CO., LTD., Beijing (CN)

(72) Inventors: Li Wang, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/279,621

(22) PCT Filed: Jul. 12, 2022

(86) PCT No.: PCT/CN2022/105233
§ 371 (c)(1),
(2) Date: Aug. 31, 2023

(87) PCT Pub. No.: WO2023/005661
PCT Pub. Date: Feb. 2, 2023

(65) Prior Publication Data
US 2024/0144870 A1    May 2, 2024

(30) Foreign Application Priority Data

Jul. 30, 2021  (WO) ............... PCT/CN2021/109890
Aug. 5, 2021   (CN) ......................... 202110897272.6

(51) Int. Cl.
*G09G 3/3233*  (2016.01)
*G09G 3/3225*  (2016.01)
(Continued)

(52) U.S. Cl.
CPC ......... *G09G 3/3233* (2013.01); *G09G 3/3225* (2013.01); *G09G 3/3266* (2013.01);
(Continued)

(58) Field of Classification Search
CPC .................................................. G09G 3/3233
See application file for complete search history.

(56) References Cited

U.S. PATENT DOCUMENTS 10,388,239 B2    8/2019  Lin et al.
10,395,589 B1    8/2019  Vahid Far et al.
(Continued)

FOREIGN PATENT DOCUMENTS

CN    102467876 A    5/2012
CN    103778889 A    5/2014
(Continued)

OTHER PUBLICATIONS

Office Action dated Aug. 3, 2022, issued in counterpart CN Application No. 202110897272.6, with English translation. (33 pages).
Office Action dated Mar. 2, 2022, issued in counterpart CN Application No. 202110898658.9, with English translation. (19 pages).
International Search Report dated Sep. 19, 2022, issued in counterpart Application No. PCT/CN2022/104828, with English translation. (15 pages).
(Continued)

*Primary Examiner* — Nan-Ying Yang
(74) *Attorney, Agent, or Firm* — WHDA, LLP

(57) ABSTRACT

Provided are a pixel circuit, a driving method, and a display device. The pixel circuit includes a light-emitting element, drive circuit, control circuit, first initialization circuit, first light-emitting control circuit and second light-emitting control circuit, wherein the control circuit causes a control terminal of the drive circuit to be electrically connected to a connection node under the control of a first scanning signal; the first initialization circuit writes a first initial voltage to the connection node under the control of a reset control signal; the first light-emitting control circuit causes a first voltage terminal to be conductively connected to a first terminal of the drive circuit under the control of a first light-emitting control signal; the second light-emitting control circuit causes a second terminal of the drive circuit to be
(Continued)

conductively connected to a first electrode of the light-emitting element under control of a second light-emitting control signal.

17 Claims, 14 Drawing Sheets

(51) Int. Cl.
  *G09G 3/3266*  (2016.01)
  *G09G 3/3275*  (2016.01)
  *G09G 3/3291*  (2016.01)
  *H10K 59/121*  (2023.01)
  *H10K 59/126*  (2023.01)
(52) U.S. Cl.
  CPC ......... *G09G 3/3275* (2013.01); *G09G 3/3291* (2013.01); *H10K 59/1213* (2023.02); *G09G 2300/0426* (2013.01); *G09G 2300/0452* (2013.01); *G09G 2300/0819* (2013.01); *G09G 2300/0842* (2013.01); *G09G 2300/0852* (2013.01); *G09G 2300/0861* (2013.01); *G09G 2310/0251* (2013.01); *G09G 2310/061* (2013.01); *G09G 2310/08* (2013.01); *G09G 2320/0233* (2013.01); *G09G 2320/0247* (2013.01); *G09G 2320/045* (2013.01); *G09G 2330/021* (2013.01); *H10K 59/1216* (2023.02); *H10K 59/126* (2023.02)

(56) References Cited

U.S. PATENT DOCUMENTS

| | | |
|---|---|---|
| 2007/0132694 A1 | 6/2007 | Uchino et al. |
| 2008/0150846 A1* | 6/2008 | Chung ................. G09G 3/3233 345/80 |
| 2009/0231308 A1 | 9/2009 | Numao |
| 2009/0289558 A1 | 11/2009 | Oku |
| 2009/0289876 A1 | 11/2009 | Chun |
| 2012/0105410 A1 | 5/2012 | Choi et al. |
| 2013/0002632 A1 | 1/2013 | Choi |
| 2015/0077412 A1* | 3/2015 | Nakamura ........... G09G 3/2007 345/212 |
| 2015/0154906 A1 | 6/2015 | Chung |
| 2015/0371587 A1 | 12/2015 | Chen et al. |
| 2017/0124941 A1 | 5/2017 | Na et al. |
| 2017/0193901 A1 | 7/2017 | Wang et al. |
| 2018/0006099 A1 | 1/2018 | Ka et al. |
| 2018/0047337 A1 | 2/2018 | Zhu et al. |
| 2018/0130410 A1 | 5/2018 | Gao et al. |
| 2018/0158407 A1 | 6/2018 | Chai et al. |
| 2018/0301092 A1 | 10/2018 | Ma |
| 2019/0057646 A1 | 2/2019 | Lin et al. |
| 2019/0058029 A1 | 2/2019 | Woo et al. |
| 2019/0228706 A1 | 7/2019 | Umeda et al. |
| 2020/0142525 A1 | 5/2020 | Han et al. |
| 2020/0160787 A1 | 5/2020 | Wang et al. |
| 2020/0160788 A1 | 5/2020 | Son |
| 2020/0184893 A1 | 6/2020 | Dong |
| 2020/0226978 A1 | 7/2020 | Lin et al. |
| 2020/0273411 A1 | 8/2020 | Gao et al. |
| 2020/0286972 A1 | 9/2020 | Seo et al. |
| 2020/0312223 A1 | 10/2020 | Yuan et al. |
| 2020/0357872 A1 | 11/2020 | Kim |
| 2020/0388229 A1 | 12/2020 | Zhang et al. |
| 2020/0394961 A1 | 12/2020 | Kim et al. |
| 2020/0410924 A1 | 12/2020 | Xiong et al. |
| 2021/0005137 A1 | 1/2021 | Toyomura |
| 2021/0027696 A1 | 1/2021 | Kim et al. |
| 2021/0118361 A1 | 4/2021 | Li |
| 2021/0134224 A1 | 5/2021 | He et al. |
| 2021/0174736 A1* | 6/2021 | Yang ................. G09G 3/3233 |
| 2021/0193049 A1 | 6/2021 | Lin et al. |
| 2021/0217352 A1 | 7/2021 | Xuan et al. |
| 2021/0225282 A1 | 7/2021 | Cho et al. |
| 2021/0280130 A1 | 9/2021 | Wang et al. |
| 2021/0287605 A1 | 9/2021 | Wang et al. |
| 2021/0366363 A1 | 11/2021 | Lee et al. |
| 2021/0366386 A1 | 11/2021 | Gao |
| 2021/0366397 A1 | 11/2021 | Na |
| 2021/0375193 A1 | 12/2021 | Son et al. |
| 2021/0383752 A1 | 12/2021 | Yang |
| 2021/0407383 A1 | 12/2021 | Lai et al. |
| 2021/0407419 A1 | 12/2021 | Li et al. |
| 2022/0005414 A1 | 1/2022 | Liu et al. |
| 2022/0028338 A1 | 1/2022 | Yang et al. |
| 2022/0130322 A1 | 4/2022 | Yuan et al. |
| 2022/0139968 A1 | 5/2022 | Li et al. |
| 2022/0157238 A1* | 5/2022 | Wang .................. G09G 3/3233 |
| 2022/0165213 A1 | 5/2022 | Huang et al. |
| 2022/0165984 A1 | 5/2022 | Choi et al. |
| 2022/0208932 A1 | 6/2022 | Yun |
| 2022/0270552 A1 | 8/2022 | Roh et al. |
| 2022/0310017 A1 | 9/2022 | Yang |
| 2022/0358879 A1 | 11/2022 | Wang et al. |
| 2022/0376024 A1 | 11/2022 | Zheng et al. |
| 2023/0360600 A1 | 11/2023 | Wang et al. |
| 2024/0013727 A1 | 1/2024 | Zhang et al. |

FOREIGN PATENT DOCUMENTS

| | | |
|---|---|---|
| CN | 104091560 A | 10/2014 |
| CN | 105427803 A | 3/2016 |
| CN | 105427806 A | 3/2016 |
| CN | 106384739 A | 2/2017 |
| CN | 205920745 U | 2/2017 |
| CN | 106910468 A | 6/2017 |
| CN | 107146577 A | 9/2017 |
| CN | 107256695 A | 10/2017 |
| CN | 107274830 A | 10/2017 |
| CN | 107358918 A | 11/2017 |
| CN | 107564468 A | 1/2018 |
| CN | 107610651 A | 1/2018 |
| CN | 107803636 A | 3/2018 |
| CN | 108133687 A | 6/2018 |
| CN | 108206008 A | 6/2018 |
| CN | 108777130 A | 11/2018 |
| CN | 109102778 A | 12/2018 |
| CN | 109215582 A | 1/2019 |
| CN | 109285500 A | 1/2019 |
| CN | 109427293 A | 3/2019 |
| CN | 109599062 A | 4/2019 |
| CN | 109817165 A | 5/2019 |
| CN | 110021273 A | 7/2019 |
| CN | 110033734 A | 7/2019 |
| CN | 110176213 A | 8/2019 |
| CN | 110226195 A | 9/2019 |
| CN | 110648629 A | 1/2020 |
| CN | 110660360 A | 1/2020 |
| CN | 110767163 A | 2/2020 |
| CN | 111158514 A | 5/2020 |
| CN | 111199711 A | 5/2020 |
| CN | 111354307 A | 6/2020 |
| CN | 111354314 A | 6/2020 |
| CN | 111402809 A | 7/2020 |
| CN | 111435587 A | 7/2020 |
| CN | 111445854 A | 7/2020 |
| CN | 111489700 A | 8/2020 |
| CN | 111508426 A | 8/2020 |
| CN | 111583866 A | 8/2020 |
| CN | 111710299 A | 9/2020 |
| CN | 111724745 A | 9/2020 |
| CN | 111754922 A | 10/2020 |
| CN | 111754938 A | 10/2020 |
| CN | 111798789 A | 10/2020 |
| CN | 111883055 A | 11/2020 |
| CN | 112053661 A | 12/2020 |
| CN | 112116890 A | 12/2020 |
| CN | 112133253 A | 12/2020 |
| CN | 112233616 A | 1/2021 |
| CN | 112289269 A | 1/2021 |
| CN | 112331678 A | 2/2021 |
| CN | 112365844 A | 2/2021 |

(56) References Cited

FOREIGN PATENT DOCUMENTS

| | | |
|---|---|---|
| CN | 112382235 A | 2/2021 |
| CN | 112397026 A | 2/2021 |
| CN | 112397029 A | 2/2021 |
| CN | 112397030 A | 2/2021 |
| CN | 112397565 A | 2/2021 |
| CN | 112420794 A | 2/2021 |
| CN | 112435630 A | 3/2021 |
| CN | 112599099 A | 4/2021 |
| CN | 112753065 A | 5/2021 |
| CN | 112767873 A | 5/2021 |
| CN | 112909054 A | 6/2021 |
| CN | 112992071 A | 6/2021 |
| CN | 113097247 A | 7/2021 |
| CN | 113140179 A | 7/2021 |
| CN | 113224123 A | 8/2021 |
| CN | 113450717 A | 9/2021 |
| CN | 113838419 A | 12/2021 |
| CN | 114627807 A | 6/2022 |
| CN | 114694586 A | 7/2022 |
| JP | 2007-011214 A | 1/2007 |
| JP | 2019-128447 A | 8/2019 |
| KR | 20090122119 A | 11/2009 |
| KR | 20130007214 A | 1/2013 |
| KR | 20130055450 A | 5/2013 |
| KR | 20170049778 A | 5/2017 |
| WO | 2019/163402 A1 | 8/2019 |
| WO | 2020/037767 A1 | 2/2020 |

OTHER PUBLICATIONS

International Search Report dated Oct. 10, 2022, issued in counterpart Application No. PCT/CN2022/106018, with English translation. (12 pages).
International Search Report dated Sep. 27, 2022, issued in counterpart Application No. PCT/CN2022/106020, with English translation. (15 pages).
International Search Report dated Apr. 28, 2022, issued in counterpart Application No. PCT/CN2021/109890, with English translation. (17 pages).
International Search Report dated Sep. 23, 2022, issued in counterpart Application No. PCT/CN2022/105233, with English translation. (15 pages).
International Search Report dated Sep. 19, 2022, issued in counterpart Application No. PCT/CN2022/105232, with English translation. (14 pages).
Non-Final Office Action dated Mar. 1, 2024, issued in U.S. Appl. No. 18/273,695. (21 pages).
Non-Final Office Action dated Aug. 12, 2024, issued in U.S. Appl. No. 18/270,094 (42 pages).
Non-Final Office Action dated Jun. 13, 2024, issued in U.S. Appl. No. 17/788,727 (47 pages).
Office Action dated Dec. 13, 2024, issued in counterpart CN Application No. 202110897319.9, with English translation. (43 pages).

* cited by examiner

PIXEL CIRCUIT, DRIVING METHOD, AND DISPLAY DEVICE

CROSS-REFERENCE TO RELATED APPLICATIONS

This application is the U.S. national phase of PCT Application No. PCT/CN2022/105233 filed on Jul. 12, 2022, which claims priority to PCT International Application No. PCT/CN2021/109890, filed on Jul. 30, 2021, and Chinese Patent Application No. 202110897272.6, filed on Aug. 5, 2021 in China, disclosures of which are hereby incorporated by reference in their entireties.

TECHNICAL FIELD

The present disclosure relates to the technical field of displays, and more particularly, to a pixel circuit, a driving method, and a display device.

BACKGROUND

When a display panel in the related art is in operation, the hysteresis of the drive transistor in the drive circuit included in a pixel circuit may cause the characteristic response of the drive transistor to be relatively slow, thereby affecting display performance.

SUMMARY

In one aspect, an embodiment of the present disclosure provides a pixel circuit including a light-emitting element, a drive circuit, a control circuit, a first initialization circuit, a first light-emitting control circuit and a second light-emitting control circuit, wherein
 the control circuit is electrically connected to a first scanning line, a control terminal of the drive circuit and a connection node, and is used for causing, under the control of a first scanning signal provided by the first scanning line, the control terminal of the drive circuit to be electrically connected to the connection node;
 the first initialization circuit is electrically connected to a reset control line, the connection node and a first initial voltage line, and is used for writing, under the control of a reset control signal provided by the reset control line, a first initial voltage provided by the first initial voltage line to the connection node;
 the first light-emitting control circuit is electrically connected to a first light-emitting control line, a first voltage terminal and a first terminal of the drive circuit, and is used for causing, under the control of a first light-emitting control signal provided by the first light-emitting control line, the first voltage terminal to be conductively connected to the first terminal of the drive circuit;
 the second light-emitting control circuit is electrically connected to a second light-emitting control line, a second terminal of the drive circuit and a first electrode of the light-emitting element, and is used for causing, under the control of a second light-emitting control signal provided by the second light-emitting control line, the second terminal of the drive circuit to be conductively connected to the first electrode of the light-emitting element;
 the drive circuit is used for causing the first terminal of the drive circuit to be conductively connected to the second terminal of the drive circuit under the control of a potential at the control terminal of the drive circuit.

Optionally, in at least one embodiment of the present disclosure, the pixel circuit further includes a reset circuit:
 the reset circuit is electrically connected to a reset control line and the first terminal of the drive circuit, and is used for initializing a potential of the first terminal of the drive circuit under the control of the reset control signal; or,
 the reset circuit is electrically connected to the reset control line and the second terminal of the drive circuit, and is used for initializing a potential of the second terminal of the drive circuit under the control of the reset control signal.

Optionally, the reset circuit includes a first transistor;
 a control electrode of the first transistor is electrically connected to the reset control line, a first electrode of the first transistor is electrically connected to a reset voltage line, and a second electrode of the first transistor is electrically connected to the first terminal of the drive circuit or the second terminal of the drive circuit; the reset voltage line is used for providing a reset voltage.

Optionally, the reset circuit includes a first transistor;
 a control electrode of the first transistor and a first electrode of the first transistor are electrically connected to the reset control line, and a second electrode of the first transistor is electrically connected to the first terminal of the drive circuit or the second terminal of the drive circuit.

Optionally, the first light-emitting control circuit includes a second transistor, and the second light-emitting control circuit includes a third transistor;
 a control electrode of the second transistor is electrically connected to the first light-emitting control line, a first electrode of the second transistor is electrically connected to the first voltage terminal, and a second electrode of the second transistor is electrically connected to the first terminal of the drive circuit;
 a control electrode of the third transistor is electrically connected to the second light-emitting control line, a first electrode of the third transistor is electrically connected to the second terminal of the drive circuit, and a second electrode of the third transistor is electrically connected to the first electrode of the light-emitting element.

Optionally, the first light-emitting control line and the second light-emitting control line are different light-emitting control lines; or,
 the first light-emitting control line and the second light-emitting control line are the same light-emitting control line.

Optionally, the control circuit includes a fourth transistor:
 a control electrode of the fourth transistor is electrically connected to the first scanning line, a first electrode of the fourth transistor is electrically connected to the control terminal of the drive circuit, and a second electrode of the fourth transistor is electrically connected to the connection node;
 the fourth transistor is an oxide thin-film transistor.

Optionally, the pixel circuit according to at least one embodiment of the present disclosure further includes a second initialization circuit;
 the second initialization circuit is electrically connected to an initial control line, a second initial voltage line and the first electrode of the light-emitting element, and is used for writing, under the control of an initial control signal provided by the initial control line, a second initial voltage provided by the second initial voltage line to the first electrode of the light-emitting element.

Optionally, the second initialization circuit includes a fifth transistor;
- a control electrode of the fifth transistor is electrically connected to the initial control line, a first electrode of the fifth transistor is electrically connected to the second initial voltage line, and a second electrode of the fifth transistor is electrically connected to the first electrode of the light-emitting element;
- the fifth transistor is an oxide thin-film transistor; the initial control line is the first light-emitting control line or the second light-emitting control line.

Optionally, the pixel circuit according to at least one embodiment of the present disclosure further includes a compensation control circuit, a data writing circuit and an energy storage circuit;
- the compensation control circuit is electrically connected to a second scanning line, the connection node and the second terminal of the drive circuit, and is used for causing, under the control of a second scanning signal provided by the second scanning line, the connection node to be conductively connected to the second terminal of the drive circuit;
- the data writing circuit is electrically connected to the second scanning line, a data line and the first terminal of the drive circuit, and is used for writing, under the control of the second scanning signal, a data voltage on the data line to the first terminal of the drive circuit;
- the energy storage circuit is electrically connected to the control terminal of the drive circuit, and is used for storing electric energy.

Optionally, the first initialization circuit includes a sixth transistor, the compensation control circuit includes a seventh transistor, the data writing circuit includes an eighth transistor, the drive circuit includes a drive transistor, and the energy storage circuit includes a storage capacitor;
- a control electrode of the sixth transistor is electrically connected to the reset control line, a first electrode of the sixth transistor is electrically connected to the first initial voltage line, and a second electrode of the sixth transistor is electrically connected to the connection node;
- a control electrode of the seventh transistor is electrically connected to the second scanning line, a first electrode of the seventh transistor is electrically connected to the connection node, and a second electrode of the seventh transistor is electrically connected to a second electrode of the drive transistor;
- a control electrode of the eighth transistor is electrically connected to the second scanning line, a first electrode of the eighth transistor is electrically connected to the data line, and a second electrode of the eighth transistor is electrically connected to a first electrode of the drive transistor;
- a first terminal of the storage capacitor is electrically connected to a control electrode of the drive transistor, and a second terminal of the storage capacitor is electrically connected to the first voltage terminal.

In a second aspect, an embodiment of the present disclosure further provides a driving method applied to the above-mentioned pixel circuit, a display cycle including an initialization phase; the driving method includes:
- in the initialization phase, writing, by the first initialization circuit under the control of the reset control signal, the first initial voltage to the connection node, and causing, by the control circuit under the control of the first scanning signal, the control terminal of the drive circuit to be electrically connected to the connection node, so as to write the first initial voltage to the control terminal of the drive circuit and cause the drive transistor in the drive circuit to be in a predetermined bias state at the end of the initialization phase.

Optionally, the predetermined bias state is an off-bias state; the driving method further includes:
- in the initialization phase, causing, by the second light-emitting control circuit under the control of the second light-emitting control signal, the second terminal of the drive circuit to be conductively connected to the first electrode of the light-emitting element;
- at the start of the initialization phase, causing, by the drive circuit under the control of a potential at the control terminal of the drive circuit, the first terminal of the drive circuit to be conductively connected to the second terminal of the drive circuit, to vary a potential at the first terminal of the drive circuit until the drive transistor included in the drive circuit turns off, and the drive transistor is in an off-bias state.

Optionally, the predetermined bias state is an on-bias state, the driving method further includes:
- in the initialization phase, causing, by the first light-emitting control circuit under the control of the first light-emitting control signal, the first terminal of the drive circuit to be conductively connected to the first voltage terminal, such that the drive transistor in the drive circuit is in an on-bias state.

Optionally, the pixel circuit further includes a data writing circuit, and the display cycle further includes a data writing phase following the initialization phase; the driving method further includes:
- in the data writing phase, writing, by the data writing circuit under the control of a second scanning line, a data voltage on a data line to the first terminal of the drive circuit.

Optionally, the pixel circuit further includes a second initialization circuit; the driving method further includes:
- writing, by the second initialization circuit under the control of an initial control signal, a second initial voltage to the first electrode of the light-emitting element to control the light-emitting element not to emit light.

In a third aspect, an embodiment of the present disclosure further provides a driving method applied to the above-mentioned pixel circuit, wherein the pixel circuit further includes a reset circuit; the first light-emitting control line and the second light-emitting control line are the same light-emitting control line; the display cycle includes an initialization phase;
the driving method includes:
- in the initialization phase, writing, by the first initialization circuit under the control of a reset control signal, the first initial voltage to the connection node, and causing, by the control circuit under the control of the first scanning signal, the control terminal of the drive circuit to be electrically connected to the connection node so as to write the first initial voltage to the control terminal of the drive circuit, and initializing, by the reset circuit under the control of the reset control signal, the potential of the first terminal of the drive circuit or the potential of the second terminal of the drive circuit.

Optionally, the pixel circuit further includes a data writing circuit, and the display cycle further includes a data writing phase following the initialization phase; the driving method further includes:

in the data writing phase, writing, by the data writing circuit under the control of a second scanning line, a data voltage on a data line to the first terminal of the drive circuit.

Optionally, the pixel circuit further includes a second initialization circuit; the driving method further includes:

writing, by the second initialization circuit under the control of an initial control signal, a second initial voltage to the first electrode of the light-emitting element to control the light-emitting element not to emit light.

In a fourth aspect, an embodiment of the present disclosure further provides a display device including the above-described pixel circuit.

DETAILED DESCRIPTION

The embodiments of the present disclosure will now be described more fully hereinafter with reference to the accompanying drawings. Obviously, the described embodiments are merely a part of, rather than all of, the embodiments of the present disclosure. Based on the embodiments of the present disclosure, a person skilled in the art may, without any creative effort, obtain other embodiments, which also fall within the scope of the present disclosure.

The transistors used in all the embodiments of the present disclosure may be triodes, thin-film transistors or field effect transistors, or other devices with the same characteristics. In embodiments of the present disclosure, in order to distinguish two electrodes of a transistor other than the control electrode, one of the two electrodes is referred to as a first electrode, while the other one is referred to as a second electrode.

In practical operation, when the transistor is a thin-film transistor or a field effect transistor, the first electrode may be the drain electrode, and the second electrode may be the source electrode; alternatively, the first electrode may the source electrode, and the second electrode may be the drain electrode.

Figure 1:
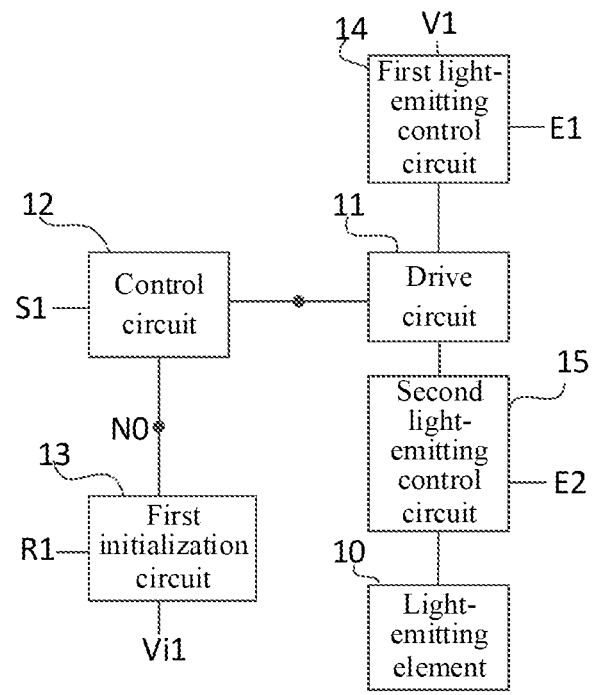
FIG. 1 is a structure diagram of a pixel circuit according to at least one embodiment of the present disclosure.

As shown in FIG. 1, the pixel circuit according to the embodiment of the present disclosure includes a light-emitting element 10, a drive circuit 11, a control circuit 12, a first initialization circuit 13, a first light-emitting control circuit 14, and a second light-emitting control circuit 15, wherein the control circuit 12 is electrically connected to the first scanning line S1, the control terminal of the drive circuit 11 and the connection node N0, and is used for causing, under the control of the first scanning signal provided by the first scanning line S1, the control terminal of the drive circuit 11 to be electrically connected to the connection node N0;

the first initialization circuit 13 is electrically connected to a reset control line R1, the connection node N0 and a first initial voltage line, and is used for writing, under the control of a reset control signal provided by the reset control line R1, a first initial voltage Vi1 provided by the first initial voltage line to the connection node N0;

the first light-emitting control circuit 14 is electrically connected to a first light-emitting control line E1, a first voltage terminal V1 and a first terminal of the drive circuit 11, and is used for causing, under the control of a first light-emitting control signal provided by the first light-emitting control line E1, the first voltage terminal V1 to be conductively connected to the first terminal of the drive circuit 11;

the second light-emitting control circuit 15 is electrically connected to a second light-emitting control line E2, a second terminal of the drive circuit 11 and a first electrode of the light-emitting element 10, and is used for causing, under the control of a second light-emitting control signal provided by the second light-emitting control line E2, the second terminal of the drive circuit 11 to be conductively connected to the first electrode of the light-emitting element 10;

the drive circuit 11 is used for causing, under the control of the potential at its control terminal, a first terminal of the drive circuit 11 to be conductively connected to a second terminal of the drive circuit 11.

When the pixel circuit according to the embodiment of the present disclosure operates, before the data voltage is written to the first terminal of the drive circuit, in an initialization phase, the control circuit 12 and the first initialization circuit 13 cooperate to write the first initial voltage Vi1 to the control terminal of the drive circuit 11, and the first light-emitting control circuit 14 or the second light-emitting control circuit 15 operates to initialize the potential at the source electrode of the drive transistor included in the drive circuit 11, so as to improve the hysteresis of the drive transistor.

In one aspect, when a pixel circuit according to an embodiment of the present disclosure is in operation, a display cycle includes an initialization phase;
  in the initialization phase, the first initialization circuit writes the first initial voltage to the connection node under the control of the reset control signal, and the control circuit causes the control terminal of the drive circuit to be electrically connected to the connection node under the control of the first scanning signal, so as to write the first initial voltage to the control terminal of the drive circuit; a second light-emitting control circuit causes a second terminal of the drive circuit to be conductively connected to a first electrode of the light-emitting element under the control of a second light-emitting control signal;
  at the start of the initialization phase, the drive circuit, under control of the potential at its control terminal, causes the first terminal of the drive circuit to be conductively connected to the second terminal of the drive circuit to change the potential of the first terminal of the drive circuit until the drive transistor included by the drive circuit turns off, to initialize the potential at the first terminal of the drive circuit.

In another aspect, when a pixel circuit according to an embodiment of the present disclosure is in operation, a display cycle includes an initialization phase;
  in the initialization phase, the first initialization circuit writes the first initial voltage to the connection node under the control of the reset control signal, and the control circuit causes the control terminal of the drive circuit to be electrically connected to the connection node under the control of the first scanning signal so as to write the first initial voltage to the control terminal of the drive circuit; the first light-emitting control circuit causes the first terminal of the drive circuit to be conductively connected to the first voltage terminal under the control of the first light-emitting control signal, to initialize the potential at the first terminal of the drive circuit.

Optionally, the pixel circuit according to at least one embodiment of the present disclosure may further include a reset circuit;
  the reset circuit is electrically connected to a reset control line and the first terminal of the drive circuit, and is used for initializing a potential of the first terminal of the drive circuit under the control of the reset control signal; or,
  the reset circuit is electrically connected to a reset control line and the second terminal of the drive circuit, and is used for initializing a potential of the second terminal of the drive circuit under the control of the reset control signal.

In at least one embodiment of the present disclosure, the potential of the first terminal of the drive circuit or the potential of the second terminal of the drive circuit may also be initialized by the reset circuit under the control of the reset control signal during an initialization phase, to improve hysteresis of the drive transistor in the drive circuit.

Figure 2:
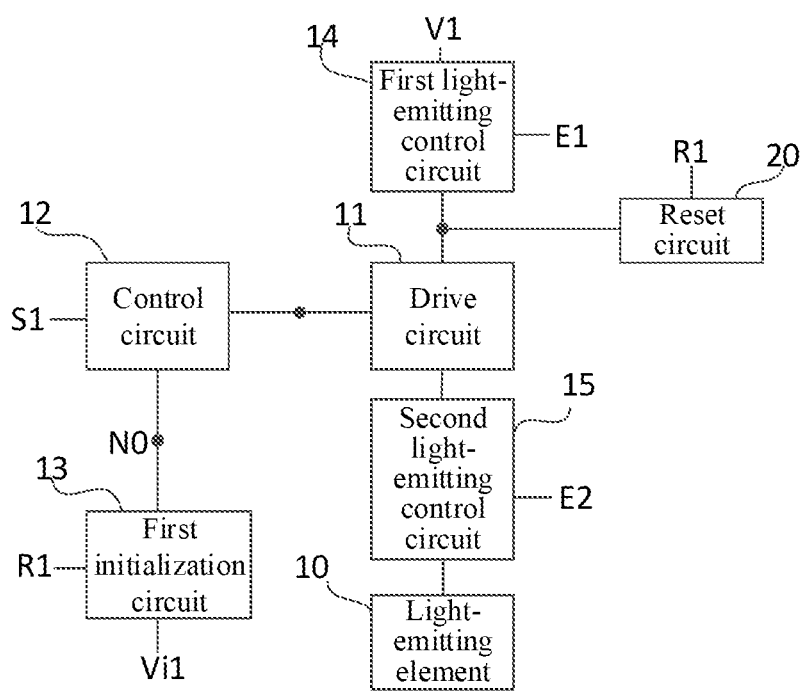
FIG. 2 is a structure diagram of a pixel circuit according to at least one embodiment of the present disclosure.

As shown in FIG. 2, on the basis of the pixel circuit shown in FIG. 1 according to at least one embodiment, the pixel circuit according to at least one embodiment of the present disclosure may further include a reset circuit 20;
  the reset circuit 20 is electrically connected to a reset control line R1 and a first terminal of the drive circuit 11, and is used for initializing the potential of the first terminal of the drive circuit 11 under the control of the reset control signal.

Figure 3:
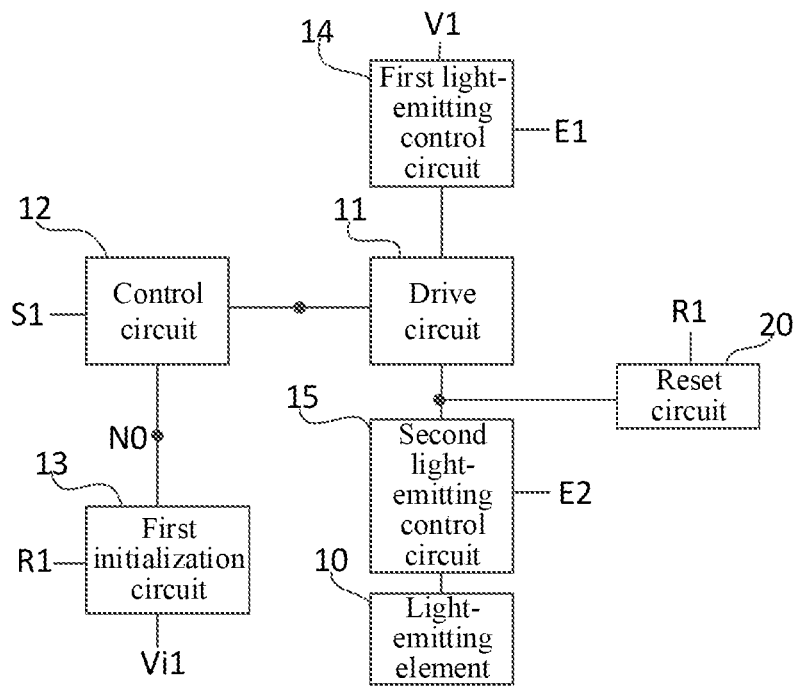
FIG. 3 is a structure diagram of a pixel circuit according to at least one embodiment of the present disclosure.

As shown in FIG. 3, on the basis of the pixel circuit shown in FIG. 1 according to at least one embodiment, the pixel circuit according to at least one embodiment of the present disclosure may further include a reset circuit 20;
  the reset circuit 20 is electrically connected to a reset control line R1 and a second terminal of the drive circuit 11, and is used for initializing the potential of the second terminal of the drive circuit 11 under the control of the reset control signal.

Optionally, the reset circuit includes a first transistor;
  a control electrode of the first transistor is electrically connected to the reset control line, a first electrode of the first transistor is electrically connected to a reset voltage line, and a second electrode of the first transistor is electrically connected to the first terminal of the drive circuit or the second terminal of the drive circuit; the reset voltage line is used for providing a reset voltage.

Optionally, the reset circuit includes a first transistor;
  a control electrode of the first transistor and a first electrode of the first transistor are electrically connected to the reset control line, and a second electrode of the first transistor is electrically connected to the first terminal of the drive circuit or the second terminal of the drive circuit.

In at least one embodiment of the present disclosure, the first light-emitting control circuit includes a second transistor and the second light-emitting control circuit includes a third transistor;
  a control electrode of the second transistor is electrically connected to the first light-emitting control line, a first electrode of the second transistor is electrically connected to the first voltage terminal, and a second electrode of the second transistor is electrically connected to the first terminal of the drive circuit;
  a control electrode of the third transistor is electrically connected to the second light-emitting control line, a first electrode of the third transistor is electrically connected to the second terminal of the drive circuit, and a second electrode of the third transistor is electrically connected to the first electrode of the light-emitting element.

In specific implementations, the first light-emitting control line and the second light-emitting control line may be different light-emitting control lines; or,
  the first lighting control line and the second lighting control line may be the same lighting control line.

Optionally, the control circuit includes a fourth transistor:
  a control electrode of the fourth transistor is electrically connected to the first scanning line, a first electrode of the fourth transistor is electrically connected to the control terminal of the drive circuit, and a second electrode of the fourth transistor is electrically connected to the connection node;

the fourth transistor is an oxide thin-film transistor, so as to reduce the leakage current at the control terminal of the drive circuit, and ensure the stability of the voltage at the first node when operating at a low frequency, which is beneficial to improving the display quality, improving the display uniformity and alleviating flicker.

The pixel circuit according to at least one embodiment of the present disclosure may further include a third initialization circuit;

the third initialization circuit is electrically connected to the initial control line, the second initial voltage line and the first electrode of the light-emitting element, and is used for writing the second initial voltage provided by the second initial voltage line to the first electrode of the light-emitting element under the control of the initial control signal provided by the initial control line, so that the light-emitting element does not emit light, and residual charges at the first electrode of the light-emitting element are removed.

Optionally, the second initialization circuit includes a fifth transistor:

a control electrode of the fifth transistor is electrically connected to the initial control line, a first electrode of the fifth transistor is electrically connected to the second initial voltage line, and a second electrode of the fifth transistor is electrically connected to the first electrode of the light-emitting element;

the fifth transistor is an oxide thin-film transistor; the initial control line is the first light-emitting control line or the second light-emitting control line.

In at least one embodiment of the present disclosure, the fifth transistor can be a p-type transistor, the control electrode of the fifth transistor can be a first light-emitting control line or a second light-emitting control line, and since the first light-emitting control signal and the second light-emitting control line are high-frequency signals themselves, a high-frequency reset of the first electrode of the light-emitting element can be conveniently performed to solve the flicker problem.

The pixel circuit according to at least one embodiment of the present disclosure may further include a compensation control circuit, a data writing circuit, and an energy storage circuit;

the compensation control circuit is electrically connected to a second scanning line, the connection node and the second terminal of the drive circuit, and is used for causing the connection node to be conductively connected to the second terminal of the drive circuit under the control of a second scanning signal provided by the second scanning line;

the data writing circuit is electrically connected to the second scanning line, a data line and the first terminal of the drive circuit, and is used for writing a data voltage on the data line to the first terminal of the drive circuit under the control of the second scanning signal;

the energy storage circuit is electrically connected to a control terminal of the drive circuit, and is used for storing electric energy.

When the pixel circuit according to at least one embodiment of the present disclosure operates, in a data writing phase following the initialization phase, the data writing circuit writes a data voltage to a first terminal of a drive circuit under the control of a second scanning signal, and the compensation control circuit causes the connection node to be conductively connected to a second terminal of the drive circuit under the control of the second scanning signal; the control circuit causes the control terminal of the drive circuit to be electrically connected to the connection node under the control of the first scanning signal, so as to write the data voltage to the control terminal of the drive circuit:

at the start of the data writing phase, the drive transistor in the drive circuit turns on to change the potential at the control terminal of the drive circuit until the drive transistor turns off, at which time the potential of the control terminal of the drive circuit is related to the threshold voltage of the drive transistor.

Optionally, the first initialization circuit includes a sixth transistor, the compensation control circuit includes a seventh transistor, the data writing circuit includes an eighth transistor, the drive circuit includes a drive transistor, and the energy storage circuit includes a storage capacitor;

a control electrode of the sixth transistor is electrically connected to the reset control line, a first electrode of the sixth transistor is electrically connected to the first initial voltage line, and a second electrode of the sixth transistor is electrically connected to the connection node;

a control electrode of the seventh transistor is electrically connected to the second scanning line, a first electrode of the seventh transistor is electrically connected to the connection node, and a second electrode of the seventh transistor is electrically connected to a second electrode of the drive transistor;

a control electrode of the eighth transistor is electrically connected to the second scanning line, a first electrode of the eighth transistor is electrically connected to the data line, and a second electrode of the eighth transistor is electrically connected to a first electrode of the drive transistor;

a first terminal of the storage capacitor is electrically connected to a control electrode of the drive transistor, and a second terminal of the storage capacitor is electrically connected to the first voltage terminal.

Figure 4:
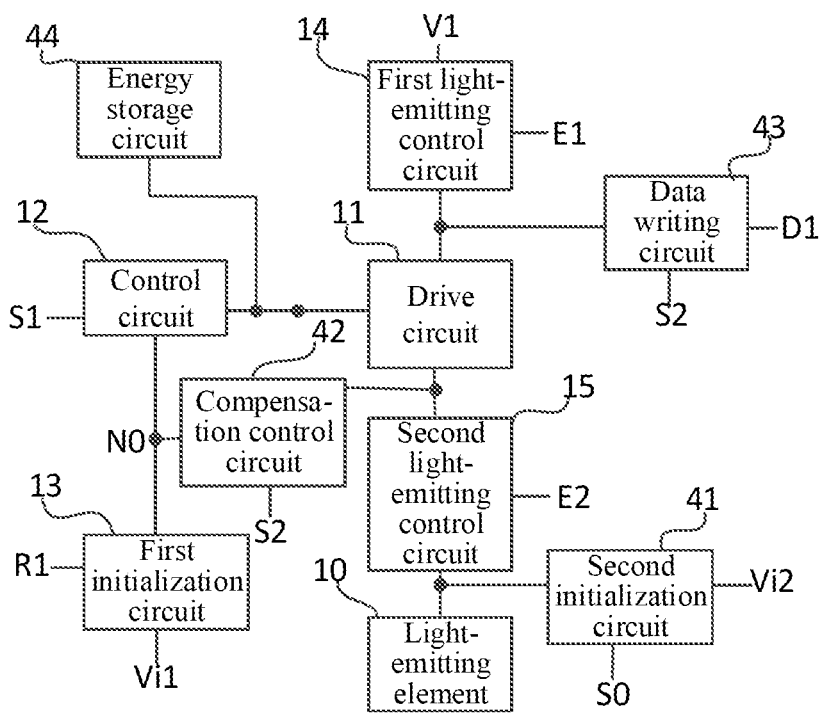
FIG. 4 is a structure diagram of a pixel circuit according to at least one embodiment of the present disclosure.

As shown in FIG. 4, on the basis of the pixel circuit shown in FIG. 1 according to at least one embodiment, the pixel circuit according to at least one embodiment of the present disclosure may further include a second initialization circuit 41, a compensation control circuit 42, a data writing circuit 43 and an energy storage circuit 44;

the second initialization circuit 41 is electrically connected to the initial control line S0, the second initial voltage line and the first electrode of the light-emitting element 10, and is used for writing the second initial voltage Vi2 provided by the second initial voltage line to the first electrode of the light-emitting element 10 under the control of the initial control signal provided by the initial control line S0;

the compensation control circuit 42 is electrically connected to the second scanning line S2, the connection node N0 and the second terminal of the drive circuit 11, and is used for causing the connection node N0 to be conductively connected to the second terminal of the drive circuit 11 under the control of the second scanning signal provided by the second scanning line S2;

the data writing circuit 43 is electrically connected to the second scanning line S2, the data line D1 and the first terminal of the drive circuit 11, and is used for writing the data voltage on the data line D1 to the first terminal of the drive circuit 11 under the control of the second scanning signal;

the energy storage circuit 44 is electrically connected to a control terminal of the drive circuit 11, and is used for storing electric energy.

In the pixel circuit shown in FIG. 4 according to at least one embodiment, the first light-emitting control line E1 and the second light-emitting control line E2 are different light-emitting control lines.

In the pixel circuit shown in FIG. 4 according to at least one embodiment, the initial control line S0 may be a second scanning line, or the initial control line S0 may be a first light-emitting control line or a second light-emitting control line.

Figure 5:
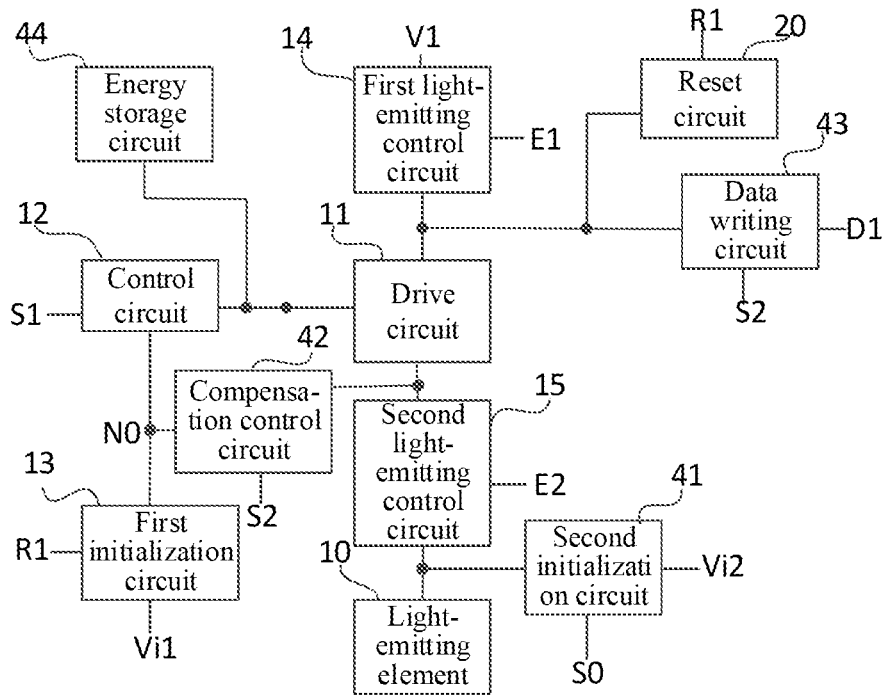
FIG. 5 is a structure diagram of a pixel circuit according to at least one embodiment of the present disclosure.

As shown in FIG. 5, on the basis of the pixel circuit shown in FIG. 2 according to at least one embodiment, the pixel circuit according to at least one embodiment of the present disclosure may further include a second initialization circuit 41, a compensation control circuit 42, a data writing circuit 43 and an energy storage circuit 44:

- the second initialization circuit 41 is electrically connected to the initial control line S0, the second initial voltage line and the first electrode of the light-emitting element 10, and is used for writing the second initial voltage Vi2 provided by the second initial voltage line to the first electrode of the light-emitting element 10 under the control of the initial control signal provided by the initial control line S0;
- the compensation control circuit 42 is electrically connected to the second scanning line S2, the connection node N0 and the second terminal of the drive circuit 11, and is used for causing the connection node N0 to be conductively connected to the second terminal of the drive circuit 11 under the control of the second scanning signal provided by the second scanning line S2;
- the data writing circuit 43 is electrically connected to the second scanning line S2, the data line D1 and the first terminal of the drive circuit 11, and is used for writing the data voltage on the data line D1 to the first terminal of the drive circuit 11 under the control of the second scanning signal;
- the energy storage circuit 44 is electrically connected to a control terminal of the drive circuit 11, and is used for storing electric energy.

In the pixel circuit shown in FIG. 5 according to at least one embodiment, the first light-emitting control line E1 and the first light-emitting control line E2 may be the same light-emitting control line, but are not limited thereto.

In the pixel circuit shown in FIG. 5 according to at least one embodiment, the initial control line S0 may be a second scanning line, or the initial control line S0 may be a first light-emitting control line or a second light-emitting control line.

Figure 6:
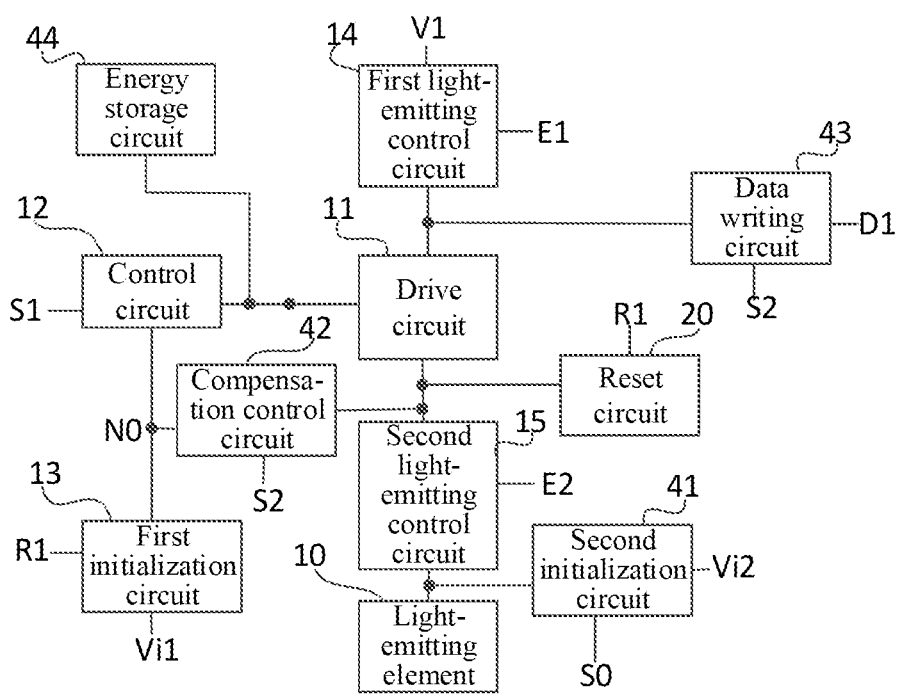
FIG. 6 is a structure diagram of a pixel circuit according to at least one embodiment of the present disclosure.

As shown in FIG. 6, on the basis of the pixel circuit shown in FIG. 3 according to at least one embodiment, the pixel circuit according to at least one embodiment of the present disclosure may further include a second initialization circuit 41, a compensation control circuit 42, a data writing circuit 43 and an energy storage circuit 44;

- the second initialization circuit 41 is electrically connected to the initial control line S0, the second initial voltage line and the first electrode of the light-emitting element 10, and is used for writing the second initial voltage Vi2 provided by the second initial voltage line to the first electrode of the light-emitting element 10 under the control of the initial control signal provided by the initial control line S0;
- the compensation control circuit 42 is electrically connected to the second scanning line S2, the connection node N0 and the second terminal of the drive circuit 11, and is used for causing the connection node N0 to be conductively connected to the second terminal of the drive circuit 11 under the control of the second scanning signal provided by the second scanning line S2;
- the data writing circuit 43 is electrically connected to the second scanning line S2, the data line D1 and the first terminal of the drive circuit 11, and is used for writing the data voltage on the data line D1 to the first terminal of the drive circuit 11 under the control of the second scanning signal;
- the energy storage circuit 44 is electrically connected to a control terminal of the drive circuit 11, and is used for storing electric energy.

In the pixel circuit shown in FIG. 6 according to at least one embodiment, the first light-emitting control line E1 and the first light-emitting control line E2 may be the same light-emitting control line, but are not limited thereto.

In the pixel circuit shown in FIG. 6 according to at least one embodiment, the initial control line S0 may be a second scanning line, or the initial control line S0 may be a first light-emitting control line or a second light-emitting control line.

In at least one embodiment of the present disclosure, the first voltage terminal may be a high voltage terminal and the second voltage terminal may be a low voltage terminal, but the present disclosure is not limited thereto.

Figure 7:
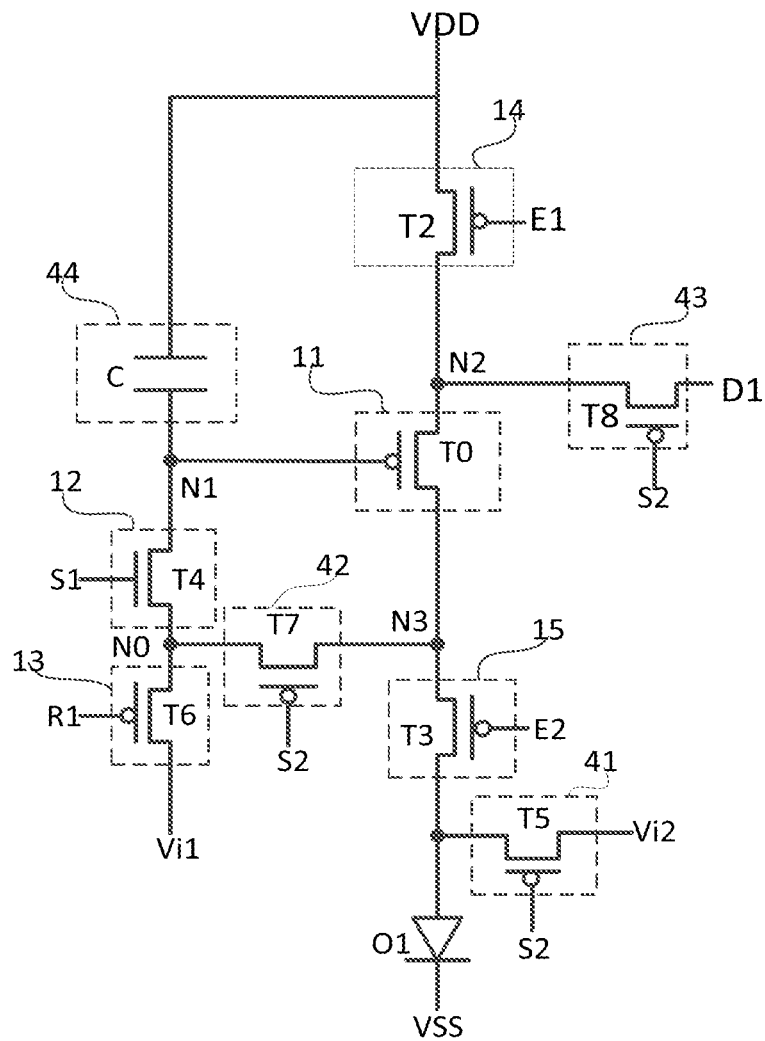
FIG. 7 is a circuit diagram of a pixel circuit according to at least one embodiment of the present disclosure.

As shown in FIG. 7, on the basis of the pixel circuit shown in FIG. 4 according to at least one embodiment, the first light-emitting control circuit 14 includes a second transistor T2, and the second light-emitting control circuit 15 includes a third transistor T3; the control circuit 12 includes a fourth transistor T4; the second initialization circuit 41 includes a fifth transistor T5; the first initialization circuit 13 includes a sixth transistor T6, the compensation control circuit 42 includes a seventh transistor T7, the data writing circuit 43 includes an eighth transistor T8, the drive circuit 11 includes a drive transistor T0, and the energy storage circuit 44 includes a storage capacitor C; the light-emitting element is an organic light-emitting diode O1;

- the gate electrode of T2 is electrically connected to the first light-emitting control line E1, the source electrode of T2 is electrically connected to the high voltage terminal, and the drain electrode of T2 is electrically connected to the source electrode of T0; the high voltage terminal is used for providing a high voltage VDD;
- the gate electrode of T3 is electrically connected to the second light-emitting control line E1, the source electrode of T3 is electrically connected to the drain electrode of T0, and the drain electrode of T3 is electrically connected to the anode of O1;
- the gate electrode of T4 is electrically connected to the first scanning line S1, the source electrode of T4 is electrically connected to the gate electrode of T0, and the drain electrode of T4 is electrically connected to the connection node N0;
- the gate electrode of T5 is electrically connected to the second scanning line S2, the source electrode of T5 is electrically connected to the second initial voltage line, and the drain electrode of T5 is electrically connected to the anode of O1; the second initial voltage line is used for providing a second initial voltage Vi2;
- the gate electrode of T6 is electrically connected to the reset control line R1, the source electrode of T6 is electrically connected to the first initial voltage line, and the drain electrode of T6 is electrically connected to the connection node N0; the first initial voltage line is used for providing a first initial voltage Vi1;

the gate electrode of the T7 is electrically connected to the second scanning line S2, the source electrode of the T7 is electrically connected to the connection node N0, and the drain electrode of the T7 is electrically connected to the drain electrode of the T0;

the gate electrode of T8 is electrically connected to the second scanning line S2, the source electrode of T8 is electrically connected to the data line D1, and the drain electrode of T8 is electrically connected to the source electrode of T0;

a first terminal of C is electrically connected to a gate electrode of T0, and a second terminal of C is electrically connected to the high voltage terminal;

the cathode of O1 is electrically connected to a low voltage terminal, and the low voltage terminal is used for providing a low voltage VSS.

In the pixel circuit shown in FIG. 7 according to at least one embodiment, the initial control line is the second scanning line.

In the pixel circuit shown in FIG. 7 according to at least one embodiment, T4 is an oxide thin-film transistor, and the other transistors may be, but are not limited to, low temperature polysilicon thin-film transistors.

In FIG. 7, the reference numeral N1 denotes a first node, the reference numeral N2 denotes a second node, and the reference numeral N3 denotes a third node; the first node N1 is electrically connected to the gate electrode of T0, the second node N2 is electrically connected to the source electrode of T0, and the third node N3 is electrically connected to the drain electrode of T0.

Figure 8:
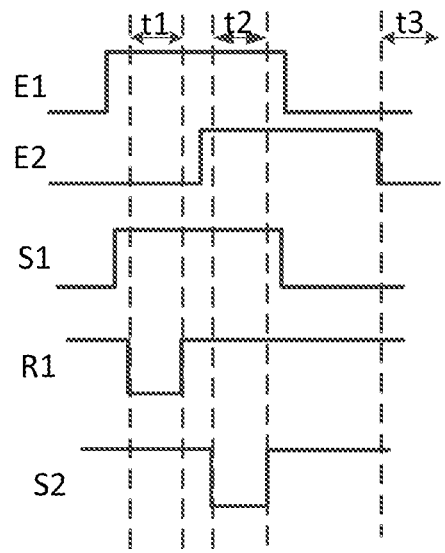
FIG. 8 is an operation timing diagram of the pixel circuit shown in FIG. 7 according to at least one embodiment.

As shown in FIG. 8, in operation of the pixel circuit shown in FIG. 7 according to at least one embodiment, the display cycle includes an initialization phase t1, a data writing phase t2 and a light-emitting phase t3 which are arranged successively, in the initialization phase t1, E1 provides a high voltage signal, E2 provides a low voltage signal, S1 provides a high voltage signal, S2 provides a high voltage signal, R1 provides a low voltage signal, T6 is on, T4 is on, T3 is on. T2 is off, the potential at N1 is initialized to Vi1, the source electrode potential of T0 decreases due to leakage current until the potential at the source electrode of T0 (namely, the potential at N2) becomes Vi1−Vth, T0 is in an off-bias state, and Vth is a threshold voltage of T0;

in the data writing phase t2, E1 provides a high voltage signal, E2 provides a high voltage signal, S1 provides a high voltage signal, S2 provides a low voltage signal, R1 provides a high voltage signal, T7. T8 and T4 are on, and a data voltage Vdata on D1 is written to N2;

at the beginning of the data writing phase t2, T0 turns on so as to charge C with the Vdata, and the potential at the gate electrode of T0 is changed until T0 turns off, at which time the potential at N1 is Vdata+Vth;

in the light-emitting phase t3. E1 provides a low voltage signal, E2 provides a low voltage signal, S1 provides a low voltage signal, S2 provides a high voltage signal, S3 provides a high voltage signal, T2 and T3 are on, T0 is on, so as to drive O1 to emit light.

In operation of the pixel circuit as shown in FIG. 7 according to at least one embodiment of the present disclosure, prior to data writing, T0 is in an off-bias state, thereby ensuring that the drive transistors in all pixel circuits are charged and compensated starting from the off-bias state, without being affected by the data voltage of a previous frame, which eliminates the effect of the hysteresis of T0, improves image retention and response time.

As shown in FIG. 8, a pulse width of the first light-emitting control signal provided by E1 needs to be greater than a pulse width of the first scanning signal provided by S1, namely, a time period in which the potential of the first light-emitting control signal provided by E1 holds at a high voltage encompasses a time period in which the potential of the first scanning signal provided by S1 holds at a high voltage, thereby ensuring that when T4 is on, T2 is off.

As shown in FIG. 8, a time period in which the potential of the first scanning signal provided by S1 holds at a high voltage needs to encompass a time period in which the potential of the reset control signal provided by R1 holds at a low voltage and a time period in which the potential of the second scanning signal provided by S2 holds at a low voltage, so as to ensure that the first scanning signal provided by S1 can control T4 to turn on during the initialization phase and the data writing phase, so as to initialize the potential at N1 during the initialization phase and to compensate for the threshold voltage of the drive transistor T0 during the data writing phase.

As shown in FIG. 8, a time period in which the potential of the second light-emitting control signal provided by E2 holds at a high voltage needs to encompass a time period in which the potential of the second scanning signal provided by S2 holds at a low voltage, to ensure that the second light-emitting control signal provided by E2 can control T3 to turn off during the data writing phase, ensuring that O1 does not emit light.

In at least one embodiment of the present disclosure, in the timing diagram shown in FIG. 8, the shortest time interval between the rising edge of the first light-emitting control signal provided by E1 and the rising edge of the first scanning signal provided by S1 may be a first predetermined time interval, and the shortest time interval between the rising edge of the first light-emitting control signal provided by E1 and the falling edge of the reset control signal provided by R1 may be a second predetermined time interval, and the first predetermined time interval and the second predetermined time interval may be greater than or equal to 0.5 µs and less than or equal to 1 µs, but the present disclosure is not limited thereto;

the shortest time interval between the rising edge of the second light-emitting control signal provided by E2 and the falling edge of the second scanning signal provided by S2 may be a third predetermined time interval, which may be greater than or equal to 0.5 µs and less than or equal to 1 µs, but the present disclosure is not limited thereto.

In operation of the pixel circuit according to at least one embodiment of the present disclosure, at the beginning of the data writing phase, T0 is on, so the voltage difference between the voltage value of Vi1 and the minimum data voltage value needs to be less than the threshold voltage Vth of T0.

Wherein the voltage value of Vi1 can be greater than or equal to −6V and less than or equal to −2V, for example, the voltage value of Vi1 can be −2V, −3V, −4V, −5V or −6V, etc. but the present disclosure is not limited thereto:

The voltage difference between the voltage value of Vi1 and the minimum data voltage value may be less than a*Vth, where a may be greater than or equal to 2 and less than or equal to 7. For example, a can be 2, 4, 6, or 7.

Vth may be greater than or equal to −5V and less than or equal to −2V; for example, Vth can be −2.5V or −3V, etc.;

the voltage value of VDD may be greater than or equal to 3V and less than or equal to 6V, for example, the voltage value of VDD may be 4.6V; but the present disclosure is not limited thereto;

the absolute value of the voltage value of VDD may be greater than 1.5 times the absolute value of Vth, for example, the absolute value of the voltage value of VDD may be 1.6 times the absolute value of Vth, 1.8 times the absolute value of Vth, 2 times the absolute value of Vth, etc.

Alternatively, the voltage value of VSS may be greater than or equal to −6V and less than or equal to −3V; for example, the voltage value of VSS may be −5V, −4V or −3V.

In at least one embodiment of the present disclosure, the voltage value of Vi2 may be greater than or equal to −7V and less than or equal to 0V. For example, the voltage value of the second initialization voltage may be −6V, −5V, −4V, −3V or −2V; but the present disclosure is not limited thereto.

Optionally, the voltage difference between the voltage value of Vi2 and the voltage value of VSS needs to be less than the light-up voltage of the light-emitting element, so that the light-emitting element does not emit light when Vi2 is applied to the first electrode of the light-emitting element.

Figure 9:
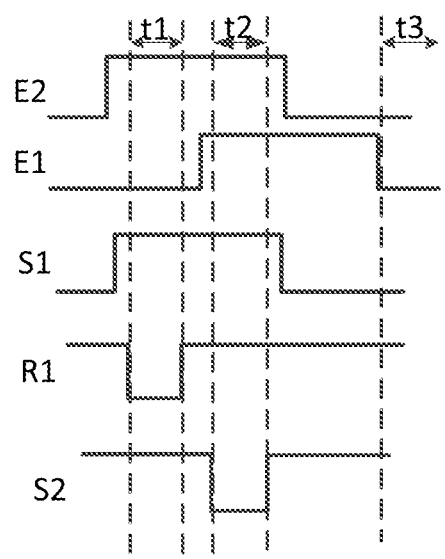
FIG. 9 is another operation timing diagram of the pixel circuit shown in FIG. 7 according to at least one embodiment.

As shown in FIG. 9, in operation of the pixel circuit shown in FIG. 7 according to at least one embodiment of the present disclosure, the display cycle includes an initialization phase t1, a data writing phase t2 and a light-emitting phase t3 which are arranged successively;

in the initialization phase t1, E1 provides a low voltage signal, E2 provides a high voltage signal, S1 provides a high voltage signal, S2 provides a high voltage signal, R1 provides a low voltage signal, T6 is on, T4 is on, T2 is on. T3 is off, the potential at N1 is initialized to Vi1, the potential at N2 is VDD, at this time, the gate-source voltage of T0 is Vi1−VDD, and T0 is in an on-bias state;

in the data writing phase t2. E1 provides a high voltage signal, E2 provides a high voltage signal, S1 provides a high voltage signal, S2 provides a low voltage signal, R1 provides a high voltage signal, T7, T8 and T4 are on, and a data voltage Vdata on D1 is written to N2; T5 is on, so that Vi2 is written to the anode of O1, thus O1 does not emit light and residual charges at the anode of O1 are removed;

at the beginning of the data writing phase t2, T0 turns on, so as to charge C with Vdata, and the potential at the gate electrode of T0 is changed until T0 turns off, at which time the potential at N1 is Vdata+Vth;

in the light-emitting phase t3, E1 provides a low voltage signal, E2 provides a low voltage signal, S1 provides a low voltage signal, S2 provides a high voltage signal, S3 provides a high voltage signal, T2 and T3 are on, T0 is on, so as to drive O1 to emit light.

In operation of the pixel circuit shown in FIG. 7 according to at least one embodiment of the present disclosure, prior to data writing, T0 is in an on-bias state, ensuring that the drive transistors in all pixel circuits are charged and compensated starting from the on-bias state, without being affected by the data voltage of a previous frame, which eliminates the effect of the hysteresis of T0, improves image retention and response time.

As shown in FIG. 9, a pulse width of the second light-emitting control signal provided by E2 needs to be greater than a pulse width of the first scanning signal provided by S1, namely, a time period in which the potential of the second light-emitting control signal provided by E2 holds at a high voltage encompasses a time period in which the potential of the first scanning signal provided by S1 holds at a high voltage, ensuring that when T4 is on, T3 is off.

As shown in FIG. 9, a time period in which the potential of the first scanning signal provided by S1 holds at the high voltage needs to encompass a time period in which the potential of the reset control signal provided by R1 holds at the low voltage and a time period in which the potential of the second scanning signal provided by S2 holds at the low voltage, to ensure that the first scanning signal provided by S1 can control T4 to turn on during the initialization phase and the data writing phase, so as to initialize the potential at N1 during the initialization phase and to compensate for the threshold voltage of the drive transistor T0 during the data writing phase.

As shown in FIG. 9, the time period in which the potential of the first light-emitting control signal provided by E1 holds at the high voltage needs to encompass the time period in which the potential of the second scanning signal provided by S2 holds at the low voltage, to ensure that the first light-emitting control signal provided by E1 can control T2 to turn off during the data writing phase, ensuring that O1 does not emit light.

In at least one embodiment of the present disclosure, in the timing diagram shown in FIG. 9, the shortest time interval between the rising edge of the second light-emitting control signal provided by E2 and the rising edge of the first scanning signal provided by S1 may be a fourth predetermined time interval, and the shortest time interval between the rising edge of the second light-emitting control signal provided by E2 and the falling edge of the reset control signal provided by R1 may be a fifth predetermined time interval, and the fourth predetermined time interval and the fifth predetermined time interval may be greater than or equal to 0.5 μs and less than or equal to 1 μs, but the present disclosure is not limited thereto;

the shortest time interval between the rising edge of the first light-emitting control signal provided by E1 and the falling edge of the second scanning signal provided by S2 may be a sixth predetermined time interval, which may be greater than or equal to 0.5 μs and less than or equal to 1 μs, but the present disclosure is not limited thereto.

Figure 10:
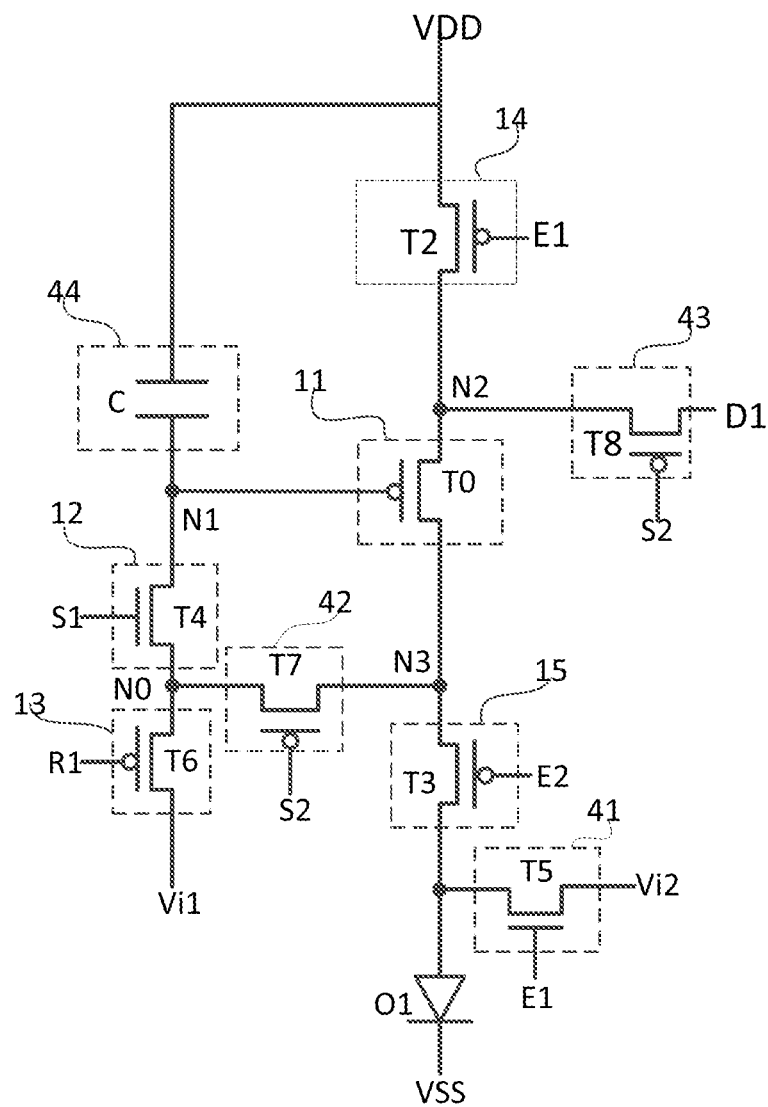
FIG. 10 is a circuit diagram of a pixel circuit according to at least one embodiment of the present disclosure.

As shown in FIG. 10, on the basis of the pixel circuit shown in FIG. 4 according to at least one embodiment, the first light-emitting control circuit 14 includes a second transistor T2, and the second light-emitting control circuit 15 includes a third transistor T3; the control circuit 12 includes a fourth transistor T4; the second initialization circuit 41 includes a fifth transistor T5; the first initialization circuit 13 includes a sixth transistor T6, the compensation control circuit 42 includes a seventh transistor T7, the data writing circuit 43 includes an eighth transistor T8, the drive circuit 11 includes a drive transistor T0, and the energy storage circuit 44 includes a storage capacitor C; the light-emitting element is an organic light-emitting diode O1;

the gate electrode of T2 is electrically connected to the first light-emitting control line E1, the source electrode of T2 is electrically connected to the high voltage terminal, and the drain electrode of T2 is electrically connected to the source electrode of T0; the high voltage terminal is used for providing a high voltage VDD;

the gate electrode of T3 is electrically connected to the second light-emitting control line E1, the source electrode of T3 is electrically connected to the drain electrode of T0, and the drain electrode of T3 is electrically connected to the anode of O1;

the gate electrode of T4 is electrically connected to the first scanning line S1, the source electrode of T4 is electrically connected to the gate electrode of T0, and the drain electrode of T4 is electrically connected to the connection node N0;

the gate electrode of T5 is electrically connected to the first light-emitting control line E1, the source electrode of T5 is electrically connected to the second initial voltage line, and the drain electrode of T5 is electrically connected to the anode of O1;

the second initial voltage line is used for providing a second initial voltage Vi2; the gate electrode of T6 is electrically connected to the reset control line R1, the source electrode of T6 is electrically connected to the first initial voltage line, and the drain electrode of T6 is electrically connected to the connection node N0; the first initial voltage line is used for providing a first initial voltage Vi1;

the gate electrode of the T7 is electrically connected to the second scanning line S2, the source electrode of the T7 is electrically connected to the connection node N0, and the drain electrode of the T7 is electrically connected to the drain electrode of the T0;

the gate electrode of T8 is electrically connected to the second scanning line S2, the source electrode of T8 is electrically connected to the data line D1, and the drain electrode of T8 is electrically connected to the source electrode of T0;

a first terminal of C is electrically connected to a gate electrode of T0, and a second terminal of C is electrically connected to the high voltage terminal;

the cathode of O1 is electrically connected to a low voltage terminal, and the low voltage terminal is used for providing a low voltage VSS.

In the pixel circuit shown in FIG. 10 according to at least one embodiment. T4 and T5 are oxide thin-film transistors, and the other transistors may be, but are not limited to, low temperature polysilicon thin-film transistors.

In FIG. 10, the reference numeral N1 denotes a first node, the reference numeral N2 denotes a second node, and the reference numeral N3 denotes a third node; the first node N1 is electrically connected to the gate electrode of T0, the second node N2 is electrically connected to the source electrode of T0, and the third node N3 is electrically connected to the drain electrode of T0.

The pixel circuit shown in FIG. 10 according to at least one embodiment differs from the pixel circuit shown in FIG. 7 according to at least one embodiment in that:

T5 is an oxide thin-film transistor, the gate electrode of T5 is electrically connected to E1, and when E1 provides a high voltage signal, T5 turns on so as to reset the potential at the anode of O1. Generally, in order to solve the flicker problem, a high-frequency control signal is required to reset the potential at the anode of O1, and the first light-emitting control signal provided by E1 is a high-frequency signal itself, so that the problem of increased power consumption caused by converting the signal controlling the gate electrode of T5 to a high-frequency signal can be eliminated.

Figure 11:
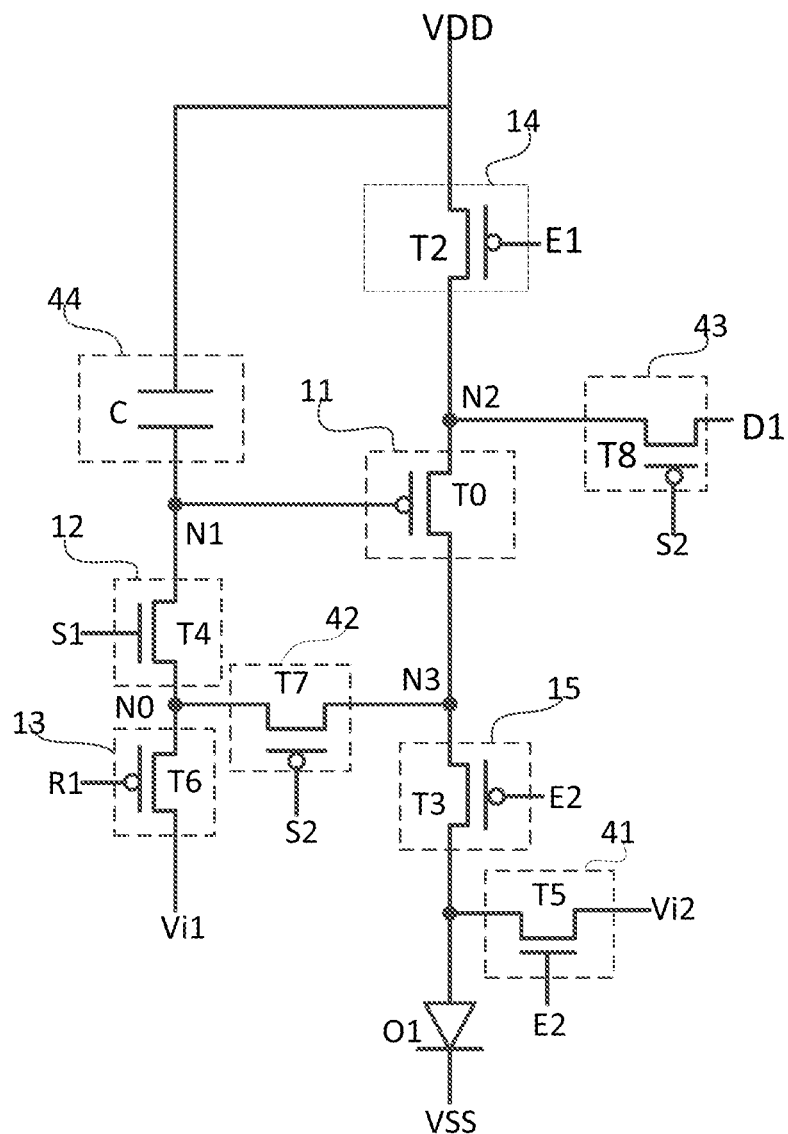
FIG. 11 is a circuit diagram of a pixel circuit according to at least one embodiment of the present disclosure.

As shown in FIG. 11, on the basis of the pixel circuit shown in FIG. 4 according to at least one embodiment, the first light-emitting control circuit 14 includes a second transistor T2, and the second light-emitting control circuit 15 includes a third transistor T3; the control circuit 12 includes a fourth transistor T4; the second initialization circuit 41 includes a fifth transistor T5; the first initialization circuit 13 includes a sixth transistor T6, the compensation control circuit 42 includes a seventh transistor T7, the data writing circuit 43 includes an eighth transistor T8, the drive circuit 11 includes a drive transistor T0, and the energy storage circuit 44 includes a storage capacitor C; the light-emitting element is an organic light-emitting diode O1;

the gate electrode of T2 is electrically connected to the first light-emitting control line E1, the source electrode of T2 is electrically connected to the high voltage terminal, and the drain electrode of T2 is electrically connected to the source electrode of T0; the high voltage terminal is used for providing a high voltage VDD;

the gate electrode of T3 is electrically connected to the second light-emitting control line E1, the source electrode of T3 is electrically connected to the drain electrode of T0, and the drain electrode of T3 is electrically connected to the anode of O1;

the gate electrode of T4 is electrically connected to the first scanning line S1, the source electrode of T4 is electrically connected to the gate electrode of T0, and the drain electrode of T4 is electrically connected to the connection node N0;

the gate electrode of T5 is electrically connected to the second light-emitting control line E2, the source electrode of T5 is electrically connected to the second initial voltage line, and the drain electrode of T5 is electrically connected to the anode of O1; the second initial voltage line is used for providing a second initial voltage Vi2;

the gate electrode of T6 is electrically connected to the reset control line R1, the source electrode of T6 is electrically connected to the first initial voltage line, and the drain electrode of T6 is electrically connected to the connection node N0; the first initial voltage line is used for providing a first initial voltage Vi1;

the gate electrode of the T7 is electrically connected to the second scanning line S2, the source electrode of the T7 is electrically connected to the connection node N0, and the drain electrode of the T7 is electrically connected to the drain electrode of the T0;

the gate electrode of T8 is electrically connected to the second scanning line S2, the source electrode of T8 is electrically connected to the data line D1, and the drain electrode of T8 is electrically connected to the source electrode of T0;

a first terminal of C is electrically connected to a gate electrode of T0, and a second terminal of C is electrically connected to the high voltage terminal;

the cathode of O1 is electrically connected to a low voltage terminal, and the low voltage terminal is used for providing a low voltage VSS.

In the pixel circuit shown in FIG. 10 according to at least one embodiment. T4 and T5 are oxide thin-film transistors, and the other transistors may be, but are not limited to, low temperature polysilicon thin-film transistors.

In FIG. 10, the reference numeral N1 denotes a first node, the reference numeral N2 denotes a second node, and the reference numeral N3 denotes a third node; the first node N1 is electrically connected to the gate electrode of T0, the second node N2 is electrically connected to the source electrode of T0, and the third node N3 is electrically connected to the drain electrode of T0.

The pixel circuit shown in FIG. 10 according to at least one embodiment differs from the pixel circuit shown in FIG. 7 according to at least one embodiment in that:

T5 is an oxide thin-film transistor, the gate electrode of T5 is electrically connected to E2, and when E2 provides a high voltage signal, T5 turns on so as to reset the potential at the anode of O1. Generally, in order to solve the flicker problem, a high-frequency control signal is required to reset the potential at the anode of O1, and the second light-emitting control signal provided by E2 is a high-frequency signal itself, so that the problem of increased power consumption caused by converting the signal controlling the gate electrode of T5 to a high-frequency signal can be eliminated.

Figure 12:
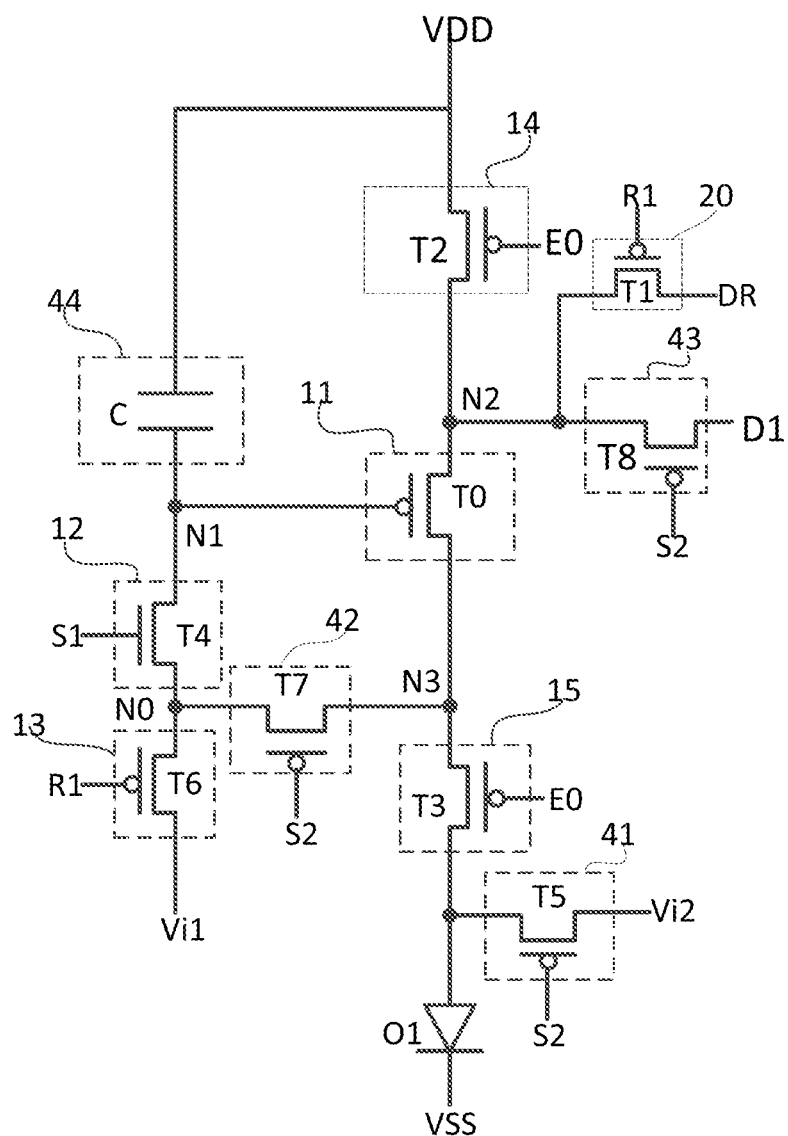
FIG. 12 is a circuit diagram of a pixel circuit according to at least one embodiment of the present disclosure.

As shown in FIG. 12, on the basis of the pixel circuit shown in FIG. 5 according to at least one embodiment, the reset circuit 20 includes a first transistor T1; the first light-emitting control circuit 14 includes a second transistor T2, and the second light-emitting control circuit 15 includes a third transistor T3; the control circuit 12 includes a fourth transistor T4; the second initialization circuit 41 includes a fifth transistor T5; the first initialization circuit 13 includes a sixth transistor T6, the compensation control circuit 42 includes a seventh transistor T7, the data writing circuit 43 includes an eighth transistor T8, the drive circuit 11 includes a drive transistor T0, and the energy storage circuit 44 includes a storage capacitor C; the light-emitting element is an organic light-emitting diode O1;

- the gate electrode of T1 is electrically connected to the reset control line R1, the source electrode of T1 is electrically connected to the reset voltage line DR, and the drain electrode of T1 is electrically connected to the source electrode of T0; the reset voltage line DR is used for supplying a reset voltage;
- the gate electrode of T2 is electrically connected to the light-emitting control line E0, the source electrode of T2 is electrically connected to the high voltage terminal, and the drain electrode of T2 is electrically connected to the source electrode of T0; the high voltage terminal is used for providing a high voltage VDD;
- the gate electrode of T3 is electrically connected to the light-emitting control line E0, the source electrode of T3 is electrically connected to the drain electrode of T0, and the drain electrode of T3 is electrically connected to the anode of O1;
- the gate electrode of T4 is electrically connected to the first scanning line S1, the source electrode of T4 is electrically connected to the gate electrode of T0, and the drain electrode of T4 is electrically connected to the connection node N0;
- the gate electrode of T5 is electrically connected to the second scanning line S2, the source electrode of T5 is electrically connected to the second initial voltage line, and the drain electrode of T5 is electrically connected to the anode of O1; the second initial voltage line is used for providing a second initial voltage Vi2;
- the gate electrode of T6 is electrically connected to the reset control line R1, the source electrode of T6 is electrically connected to the first initial voltage terminal, and the drain electrode of T6 is electrically connected to the connection node N0; the first initial voltage terminal is used for providing a first initial voltage Vi1;
- the gate electrode of the T7 is electrically connected to the second scanning line S2, the source electrode of the T7 is electrically connected to the connection node N0, and the drain electrode of the T7 is electrically connected to the drain electrode of the T0;
- the gate electrode of T8 is electrically connected to the second scanning line S2, the source electrode of T8 is electrically connected to the data line D1, and the drain electrode of T8 is electrically connected to the source electrode of T0;
- a first terminal of C is electrically connected to a gate electrode of T0, and a second terminal of C is electrically connected to the high voltage terminal;
- the cathode of O1 is electrically connected to a low voltage terminal, and the low voltage terminal is used for providing a low voltage VSS.

In the pixel circuit shown in FIG. 12 according to at least one embodiment, the first light-emitting control line and the second light-emitting control line are the same light-emitting control line E0.

In the pixel circuit shown in FIG. 12 according to at least one embodiment, T4 is an oxide thin-film transistor, and the other transistors may be, but are not limited to, low temperature polysilicon thin-film transistors.

In FIG. 12, the reference number N1 denotes a first node, the reference number N2 denotes a second node, and the reference number N3 denotes a third node; the first node N1 is electrically connected to the gate electrode of T0, the second node N2 is electrically connected to the source electrode of T0, and the third node N3 is electrically connected to the drain electrode of T0.

In the pixel circuit according to at least one embodiment of the present disclosure, the reset voltage provided by the DR may be a low voltage signal, but the present disclosure is not limited thereto; for example, the reset voltage may be Vi1, Vi2 or VSS; at this time, the voltage value of the reset voltage may be greater than or equal to −6V and less than or equal to −2V; for example, the voltage value of the reset voltage may be equal to −6V, −5V, −4V, −3V or −2V; but the present disclosure is not limited thereto:

- the reset voltage provided by the DR can also be a high voltage signal, and at this time, the voltage value of the reset voltage can be greater than or equal to 4V and less than or equal to 10V; for example, the reset voltage may have a voltage value of 4V, 5V, 6V, 7V, 8V, 9V, or 10V but the present disclosure is not limited thereto.

In operation of the pixel circuit according to at least one embodiment of the present disclosure, during the initialization phase, when T0 is in an off-bias state, the voltage value of the reset voltage is less than the minimum data voltage value, thereby ensuring that the drive circuit can start operation from a lower voltage state no matter what data voltage is applied to the first terminal of the drive circuit:

- during the initialization phase, when T0 is in the on-bias state, the voltage value of the reset voltage is greater than the maximum data voltage value, thereby ensuring that the drive circuit can start operation from a higher voltage state no matter what data voltage is applied to the first terminal of the drive circuit.

Figure 13:
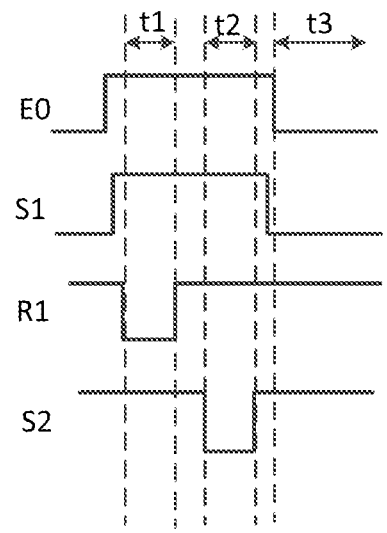
FIG. 13 is an operation timing diagram of the pixel circuit shown in FIG. 12 according to at least one embodiment.

As shown in FIG. 13, in operation of the pixel circuit shown in FIG. 12 according to at least one embodiment of the present disclosure, a display cycle includes an initialization phase t1, a data writing phase t2 and a light-emitting phase t3 arranged successively;

- in the initialization phase t1, E0 provides a high voltage signal, S1 provides a high voltage signal, R1 provides a low voltage signal, S2 provides a high voltage signal, T6, T4 and T1 are all on, V1 is written to N1, meanwhile a reset voltage is written to N2, and T0 is in an off-bias state;
- in the data writing phase t2, E0 provides a high voltage signal, S1 provides a high voltage signal, R1 provides a high voltage signal, S2 provides a low voltage signal, T7, T8 and T4 are on, and a data voltage Vdata on D1 is written to N2; T5 turns on, to write Vi2 to the anode of O1, so that O1 does not emit light and residual charges at the anode of O1 are removed;

at the beginning of the data writing phase t2, T0 turns on to charge C with Vdata, so that the potential of N1 is changed until the potential of N1 becomes Vdata+Vth, then T0 turns off;

in the light-emitting phase t3, E0 provides a low voltage signal, S1 provides a low voltage signal, S2 provides a high voltage signal, R1 provides a high voltage signal, T2, T0 and T3 are on, and T0 drives O1 to emit light.

When the pixel circuit shown in FIG. 12 according to at least one embodiment of the present disclosure operates, during the initialization phase t1, T0 is in the off state to ensure that each pixel circuit is charged and compensated starting from the off-bias state, without being affected by the data voltage of the previous frame, thereby eliminating the hysteresis effect of T0 and improving the image retention and response time.

As shown in FIG. 13, the pulse width of the light-emitting control signal provided by E0 needs to be greater than the pulse width of the first scanning signal provided by S1, namely, a time period in which the potential of the light-emitting control signal provided by E0 holds at a high voltage encompasses a time period in which the potential of the first scanning signal provided by S1 holds at a high voltage, thereby ensuring that when T4 is on, T2 and T3 are off.

As shown in FIG. 13, the time period in which the potential of the first scanning signal provided by S1 holds at a high voltage needs to encompass the time period in which the potential of the reset control signal provided by R1 holds at a low voltage and the time period in which the potential of the second scanning signal provided by S2 holds at a low voltage, so as to ensure that the first scanning signal provided by S1 can control T4 to turn on during the initialization phase and the data writing phase, so as to initialize the potential at N1 during the initialization phase and to compensate for the threshold voltage of the drive transistor T0 during the data writing phase.

As shown in FIG. 13, the time period in which the potential of the light-emitting control signal provided by E0 holds at the high voltage needs to encompass the time period in which the potential of the second scanning signal provided by S2 holds at the low voltage, to ensure that during the data writing phase, the light-emitting control signal provided by E0 can control T2 and T3 to turn off, ensuring that O1 does not emit light.

In at least one embodiment of the present disclosure, in the timing diagram shown in FIG. 13, the shortest time interval between the rising edge of the light-emitting control signal provided by E0 and the rising edge of the first scanning signal provided by S1 may be a seventh predetermined time interval, the shortest time interval between the rising edge of the light-emitting control signal provided by E0 and the falling edge of the reset control signal provided by R1 may be an eighth predetermined time interval, and the seventh predetermined time interval and the eighth predetermined time interval may be greater than or equal to 0.5 μs and less than or equal to 1 μs, but the present disclosure is not limited thereto.

Figure 14:
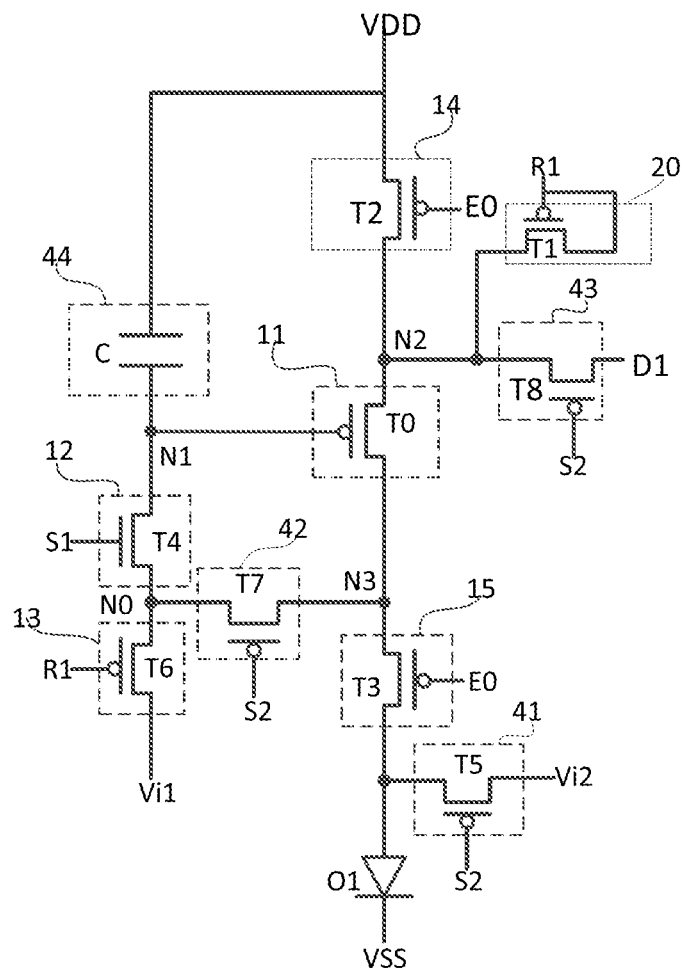
FIG. 14 is a circuit diagram of a pixel circuit according to at least one embodiment of the present disclosure.
Figure 17:
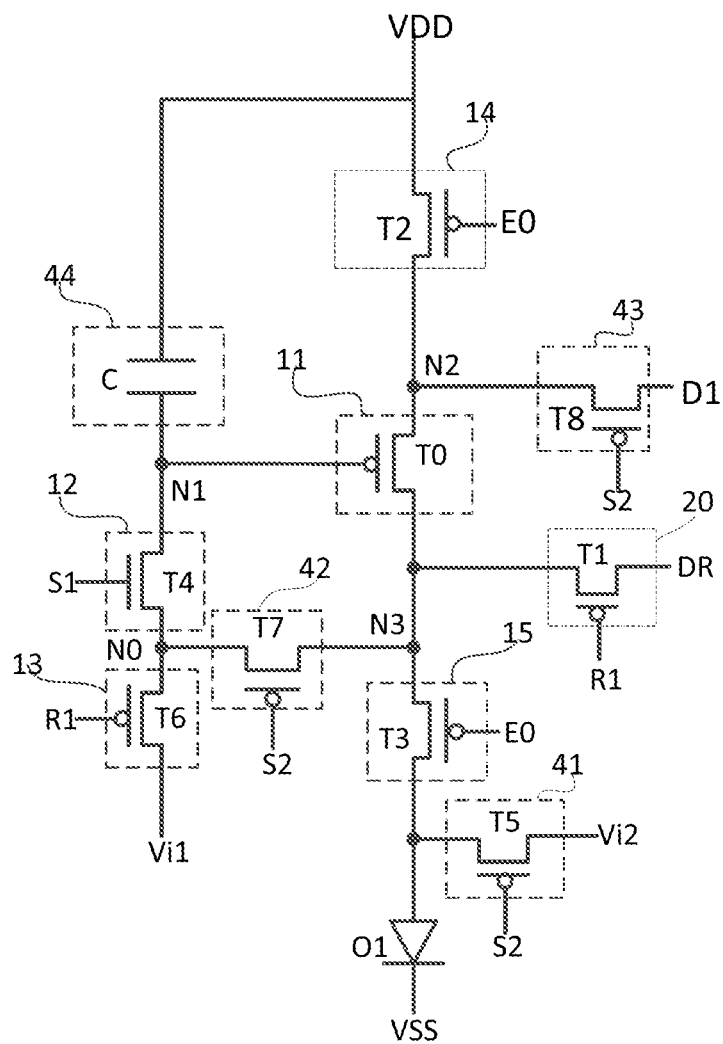
FIG. 17 is a circuit diagram of a pixel circuit according to at least one embodiment of the present disclosure.
Figure 19:
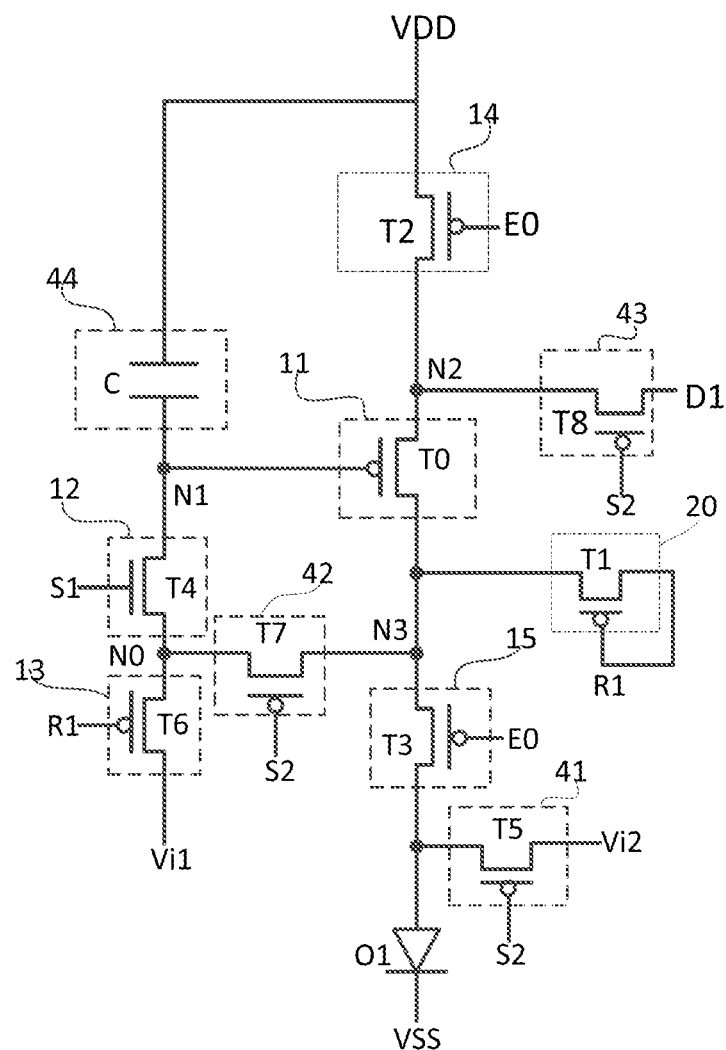
FIG. 19 is a circuit diagram of a pixel circuit according to at least one embodiment of the present disclosure.

In operation of the pixel circuit as shown in FIGS. 14, 17, and 19 according to at least one embodiment of the present disclosure, the timing of the light-emitting control signal provided by E0, the first scanning signal provided by S1, the reset control signal provided by R1 and the second scanning signal provided by S2 may also be set as described above.

As shown in FIG. 14, on the basis of the pixel circuit shown in FIG. 5 according to at least one embodiment, the reset circuit 20 includes a first transistor T1; the first light-emitting control circuit 14 includes a second transistor T2, and the second light-emitting control circuit 15 includes a third transistor T3; the control circuit 12 includes a fourth transistor T4; the second initialization circuit 41 includes a fifth transistor T5; the first initialization circuit 13 includes a sixth transistor T6, the compensation control circuit 42 includes a seventh transistor T7, the data writing circuit 43 includes an eighth transistor T8, the drive circuit 11 includes a drive transistor T0, and the energy storage circuit 44 includes a storage capacitor C; the light-emitting element is an organic light-emitting diode O1;

the gate electrode of T1 and the source electrode of T1 are both electrically connected to the reset control line R1, and the drain electrode of T1 is electrically connected to the source electrode of T0;

the gate electrode of T2 is electrically connected to the light-emitting control line E0, the source electrode of T2 is electrically connected to the high voltage terminal, and the drain electrode of T2 is electrically connected to the source electrode of T0; the high voltage terminal is used for providing a high voltage VDD;

the gate electrode of T3 is electrically connected to the light-emitting control line E0, the source electrode of T3 is electrically connected to the drain electrode of T0, and the drain electrode of T3 is electrically connected to the anode of O1;

the gate electrode of T4 is electrically connected to the first scanning line S1, the source electrode of T4 is electrically connected to the gate electrode of T0, and the drain electrode of T4 is electrically connected to the connection node N0;

the gate electrode of T5 is electrically connected to the second scanning line S2, the source electrode of T5 is electrically connected to the second initial voltage line, and the drain electrode of T5 is electrically connected to the anode of O1 the second initial voltage line is used for providing a second initial voltage Vi2;

the gate electrode of T6 is electrically connected to the reset control line R1, the source electrode of T6 is electrically connected to the first initial voltage line, and the drain electrode of T6 is electrically connected to the connection node N0; the first initial voltage line is used for providing a first initial voltage Vi1;

the gate electrode of the T7 is electrically connected to the second scanning line S2, the source electrode of the T7 is electrically connected to the connection node N0, and the drain electrode of the T7 is electrically connected to the drain electrode of the T0;

the gate electrode of T8 is electrically connected to the second scanning line S2, the source electrode of T8 is electrically connected to the data line D1, and the drain electrode of T8 is electrically connected to the source electrode of T0;

a first terminal of C is electrically connected to a gate electrode of T0, and a second terminal of C is electrically connected to the high voltage terminal;

the cathode of O1 is electrically connected to a low voltage terminal, and the low voltage terminal is used for providing a low voltage VSS.

In the pixel circuit shown in FIG. 14 according to at least one embodiment, the first light-emitting control line and the second light-emitting control line are the same light-emitting control line E0.

In the pixel circuit shown in FIG. 14 according to at least one embodiment. T4 is an oxide thin-film transistor, and the other transistors may be, but are not limited to, low temperature polysilicon thin-film transistors.

In FIG. 14, the reference numeral N1 denotes a first node, the reference numeral N2 denotes a second node, and the reference numeral N3 denotes a third node; the first node N1 is electrically connected to the gate electrode of T0, the second node N2 is electrically connected to the source electrode of T0, and the third node N3 is electrically connected to the drain electrode of T0.

Figure 15:
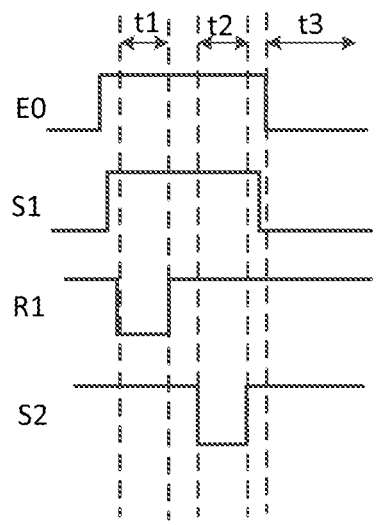
FIG. 15 is an operation timing diagram of the pixel circuit shown in FIG. 14 according to at least one embodiment.

As shown in FIG. 15, in operation of the pixel circuit shown in FIG. 14 according to at least one embodiment of the present disclosure, the display cycle includes an initialization phase t1, a data writing phase t2 and a light-emitting phase t3 arranged successively;

in the initialization phase t1, E0 provides a high voltage signal, S1 provides a high voltage signal, R1 provides a low voltage signal, S2 provides a high voltage signal, T6. T4 and T1 are all on, Vi1 is written to N1, while the low voltage signal is written to N2, and T0 is in an off-bias state;

in the data writing phase t2, E0 provides a high voltage signal, S1 provides a high voltage signal, R1 provides a high voltage signal, S2 provides a low voltage signal, T7, T8 and T4 are on, and a data voltage Vdata on D1 is written to N2; T5 turns on, to write Vi2 to the anode of O1, so that O1 does not emit light and residual charges at the anode of O1 are removed;

at the beginning of the data writing phase t2, T0 is on to charge C with Vdata, so that the potential at N1 is changed until the potential at N1 becomes Vdata+Vth, then T0 turns off;

in the light-emitting phase t3, E0 provides a low voltage signal, S1 provides a low voltage signal, S2 provides a high voltage signal, R1 provides a high voltage signal, T2, T0 and T3 are on, and T0 drives O1 to emit light.

When the pixel circuit shown in FIG. 14 according to at least one embodiment of the present disclosure operates, during the initialization phase t1, T0 is in the off state, to ensure that each pixel circuit is charged and compensated starting from the off-bias state, without being affected by the data voltage of the previous frame, thereby eliminating the effect of the hysteresis of T0 and improving the image retention and response time.

Figure 16:
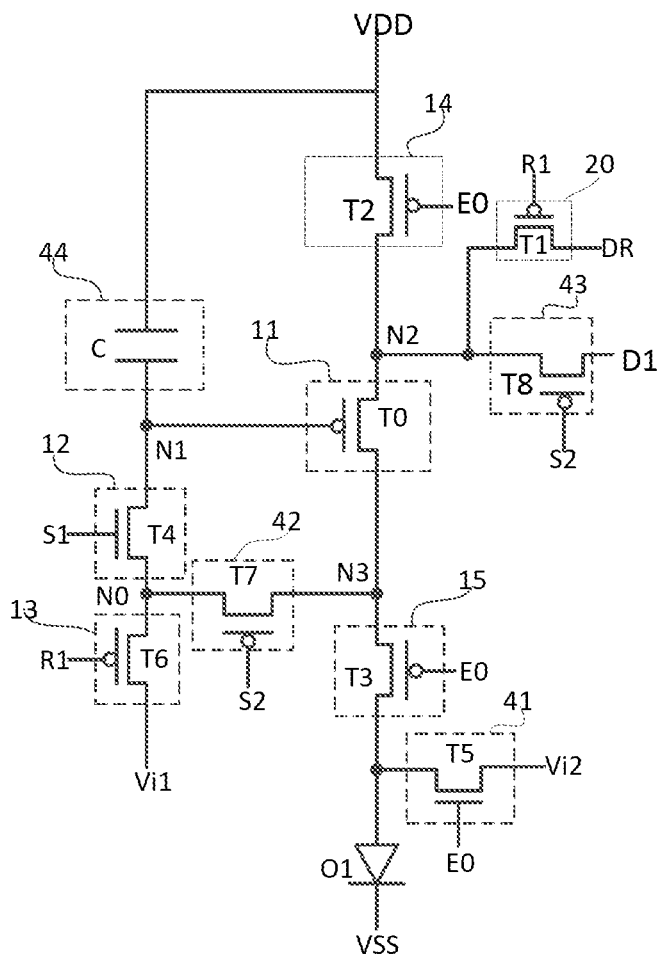
FIG. 16 is a circuit diagram of a pixel circuit according to at least one embodiment of the present disclosure.

As shown in FIG. 16, on the basis of the pixel circuit shown in FIG. 5 according to at least one embodiment, the reset circuit 20 includes a first transistor T1; the first light-emitting control circuit 14 includes a second transistor T2, and the second light-emitting control circuit 15 includes a third transistor T3; the control circuit 12 includes a fourth transistor T4; the second initialization circuit 41 includes a fifth transistor T5; the first initialization circuit 13 includes a sixth transistor T6, the compensation control circuit 42 includes a seventh transistor T7, the data writing circuit 43 includes an eighth transistor T8, the drive circuit 11 includes a drive transistor T0, and the energy storage circuit 44 includes a storage capacitor C; the light-emitting element is an organic light-emitting diode O1:

the gate electrode of T1 is electrically connected to the reset control line R1, the source electrode of T1 is electrically connected to the reset voltage line DR, and the drain electrode of T1 is electrically connected to the source electrode of T0; the reset voltage line DR is used for providing a reset voltage;

the gate electrode of T2 is electrically connected to the light-emitting control line E0, the source electrode of T2 is electrically connected to the high voltage terminal, and the drain electrode of T2 is electrically connected to the source electrode of T0; the high voltage terminal is used for providing a high voltage VDD;

the gate electrode of T3 is electrically connected to the light-emitting control line E0, the source electrode of T3 is electrically connected to the drain electrode of T0, and the drain electrode of T3 is electrically connected to the anode of O1;

the gate electrode of T4 is electrically connected to the first scanning line S1, the source electrode of T4 is electrically connected to the gate electrode of T0, and the drain electrode of T4 is electrically connected to the connection node N0;

the gate electrode of T5 is electrically connected to the light-emitting control line E0, the source electrode of T5 is electrically connected to the second initial voltage line, and the drain electrode of T5 is electrically connected to the anode of O1; the second initial voltage line is used for providing a second initial voltage Vi2;

the gate electrode of T6 is electrically connected to the reset control line R1, the source electrode of T6 is electrically connected to the first initial voltage line, and the drain electrode of T6 is electrically connected to the connection node N0; the first initial voltage line is used for providing a first initial voltage Vi1;

the gate electrode of the T7 is electrically connected to the second scanning line S2, the source electrode of the T7 is electrically connected to the connection node N0, and the drain electrode of the T7 is electrically connected to the drain electrode of the T0;

the gate electrode of T8 is electrically connected to the second scanning line S2, the source electrode of T8 is electrically connected to the data line D1, and the drain electrode of T8 is electrically connected to the source electrode of T0;

a first terminal of C is electrically connected to a gate electrode of T0, and a second terminal of C is electrically connected to the high voltage terminal;

the cathode of O1 is electrically connected to a low voltage terminal, and the low voltage terminal is used for providing a low voltage VSS.

In the pixel circuit shown in FIG. 16 according to at least one embodiment, the first light-emitting control line and the second light-emitting control line are the same light-emitting control line E0.

In the pixel circuit shown in FIG. 16 according to at least one embodiment, T4 and T5 are oxide thin-film transistors, and the other transistors may be, but are not limited to, low temperature polysilicon thin-film transistors.

In FIG. 16, the reference numeral N1 denotes a first node, the reference numeral N2 denotes a second node, and the reference numeral N3 denotes a third node; the first node N1 is electrically connected to the gate electrode of T0, the second node N2 is electrically connected to the source electrode of T0, and the third node N3 is electrically connected to the drain electrode of T0.

The pixel circuit shown in FIG. 16 according to at least one embodiment differs from the pixel circuit shown in FIG. 12 according to at least one embodiment only in that; T5 is an oxide thin-film transistor, and a gate electrode of T5 is electrically connected to a light-emitting control line E0; when E0 provides a high voltage signal, T5 turns on to reset the potential at the anode of O1. Generally, in order to solve the flicker problem, a high-frequency control signal is required to reset the potential at the anode of O1, and the second light-emitting control signal provided by E2 is a high-frequency signal itself, so that the problem of increased power consumption caused by converting the signal controlling the gate electrode of T5 to a high-frequency signal can be eliminated.

As shown in FIG. 17, on the basis of the pixel circuit shown in FIG. 6 according to at least one embodiment, the reset circuit 20 includes a first transistor T; the first light-emitting control circuit 14 includes a second transistor T2, and the second light-emitting control circuit 15 includes a third transistor T3; the control circuit 12 includes a fourth transistor T4; the second initialization circuit 41 includes a fifth transistor T5; the first initialization circuit 13 includes a sixth transistor T6, the compensation control circuit 42 includes a seventh transistor T7, the data writing circuit 43 includes an eighth transistor T8, the drive circuit 11 includes a drive transistor T0, and the energy storage circuit 44 includes a storage capacitor C; the light-emitting element is an organic light-emitting diode O1:

- the gate electrode of T1 is electrically connected to the reset control line R1, the source electrode of T1 is electrically connected to the reset voltage line DR, and the drain electrode of T1 is electrically connected to the second electrode of T0; the reset voltage line DR is used for providing a reset voltage;
- the gate electrode of T2 is electrically connected to the light-emitting control line E0, the source electrode of T2 is electrically connected to the high voltage terminal, and the drain electrode of T2 is electrically connected to the first electrode of T0; the high voltage terminal is used for providing a high voltage VDD;
- the gate electrode of T3 is electrically connected to the light-emitting control line E0, the source electrode of T3 is electrically connected to the second electrode of T0, and the drain electrode of T3 is electrically connected to the anode of O1;
- the gate electrode of T4 is electrically connected to the first scanning line S1, the source electrode of T4 is electrically connected to the gate electrode of T0, and the drain electrode of T4 is electrically connected to the connection node N0;
- the gate electrode of T5 is electrically connected to the second scanning line S2, the source electrode of T5 is electrically connected to the second initial voltage line, and the drain electrode of T5 is electrically connected to the anode of O1; the second initial voltage line is used for providing a second initial voltage Vi2;
- the gate electrode of T6 is electrically connected to the reset control line R1, the source electrode of T6 is electrically connected to the first initial voltage line, and the drain electrode of T6 is electrically connected to the connection node N0; the first initial voltage line is used for providing a first initial voltage Vi1;
- the gate electrode of the T7 is electrically connected to the second scanning line S2, the source electrode of the T7 is electrically connected to the connection node N0, and the drain electrode of the T7 is electrically connected to the second electrode of the T0;
- the gate electrode of T8 is electrically connected to the second scanning line S2, the source electrode of T8 is electrically connected to the data line D1, and the drain electrode of T8 is electrically connected to the first electrode of T0;
- a first terminal of C is electrically connected to a gate electrode of T0, and a second terminal of C is electrically connected to the high voltage terminal;
- the cathode of O1 is electrically connected to a low voltage terminal, and the low voltage terminal is used for providing a low voltage VSS.

In the pixel circuit shown in FIG. 17 according to at least one embodiment, the first light-emitting control line and the second light-emitting control line are the same light-emitting control line E0.

In the pixel circuit shown in FIG. 17 according to at least one embodiment, T4 is an oxide thin-film transistor, and the other transistors may be, but are not limited to, low temperature polysilicon thin-film transistors.

In FIG. 17, the reference numeral N1 denotes a first node, the reference numeral N2 denotes a second node, and the reference numeral N3 denotes a third node; the first node N1 is electrically connected to the gate electrode of T0, the second node N2 is electrically connected to the first electrode of T0, and the third node N3 is electrically connected to the second pole of T0.

In the pixel circuit shown in FIG. 17 according to at least one embodiment, the reset voltage provided by the DR may be a low voltage signal, but the present disclosure is not limited thereto. For example, the reset voltage may be Vi1, Vi2, or VSS.

Figure 18:
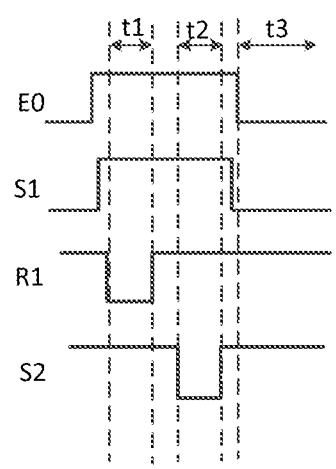
FIG. 18 is an operation timing diagram of the pixel circuit shown in FIG. 17 according to at least one embodiment.

As shown in FIG. 18, in operation of the pixel circuit shown in FIG. 17 according to at least one embodiment of the present disclosure, the display cycle includes an initialization phase t1, a data writing phase t2 and a light-emitting phase t3 arranged successively;

- in the initialization phase t1, E0 provides a high voltage signal, S1 provides a high voltage signal, R1 provides a low voltage signal, S2 provides a high voltage signal, T6, T4 and T1 are all on, V1 is written to N1, meanwhile a reset voltage is written to N3, and T0 is in an off-bias state;
- in the data writing phase t2, E0 provides a high voltage signal, S1 provides a high voltage signal, R1 provides a high voltage signal, S2 provides a low voltage signal, T7, T8 and T4 are on, and a data voltage Vdata on D1 is written to N2; T5 turns on to write Vi2 to the anode of O1, so that O1 does not emit light and residual charges at the anode of O1 are removed;
- at the beginning of the data writing phase t2, T0 turns on to charge C with Vdata, so that the potential at N1 is changed until the potential at N1 becomes Vdata+Vth, then T0 turns off;
- in the light-emitting phase t3, E0 provides a low voltage signal, S1 provides a low voltage signal, S2 provides a high voltage signal, R1 provides a high voltage signal, T2, T0 and T3 are on, and T0 drives O1 to emit light.

When the pixel circuit shown in FIG. 17 according to at least one embodiment of the present disclosure operates, during the initialization phase t1, T0 is in an off state to ensure that each pixel circuit is charged and compensated starting from the off-bias state, without being affected by the data voltage of the previous frame, thereby eliminating the effect of the hysteresis of T0 and improving the image retention and response time.

As shown in FIG. 19, on the basis of the pixel circuit shown in FIG. 6 according to at least one embodiment, the reset circuit 20 includes a first transistor T1; the first light-emitting control circuit 14 includes a second transistor T2, and the second light-emitting control circuit 15 includes a third transistor T3; the control circuit 12 includes a fourth transistor T4; the second initialization circuit 41 includes a fifth transistor T5; the first initialization circuit 13 includes a sixth transistor T6, the compensation control circuit 42 includes a seventh transistor T7, the data writing circuit 43 includes an eighth transistor T8, the drive circuit 11 includes a drive transistor T0, and the energy storage circuit 44 includes a storage capacitor C; the light-emitting element is an organic light-emitting diode O1:

the gate electrode of T1 and the source electrode of T1 are both electrically connected to the reset control line R1, and the drain electrode of T1 is electrically connected to the second electrode of T0;

the gate electrode of T2 is electrically connected to the light-emitting control line E0, the source electrode of T2 is electrically connected to the high voltage terminal, and the drain electrode of T2 is electrically connected to the first electrode of T0; the high voltage terminal is used for providing a high voltage VDD;

the gate electrode of T3 is electrically connected to the light-emitting control line E0, the source electrode of T3 is electrically connected to the second electrode of T0, and the drain electrode of T3 is electrically connected to the anode of O1;

the gate electrode of T4 is electrically connected to the first scanning line S1, the source electrode of T4 is electrically connected to the gate electrode of T0, and the drain electrode of T4 is electrically connected to the connection node N0;

the gate electrode of T5 is electrically connected to the second scanning line S2, the source electrode of T5 is electrically connected to the second initial voltage line, and the drain electrode of T5 is electrically connected to the anode of O1; the second initial voltage line is used for providing a second initial voltage Vi2;

the gate electrode of T6 is electrically connected to the reset control line R1, the source electrode of T6 is electrically connected to the first initial voltage line, and the drain electrode of T6 is electrically connected to the connection node N0; the first initial voltage line is used for providing a first initial voltage Vi1;

the gate electrode of the T7 is electrically connected to the second scanning line S2, the source electrode of the T7 is electrically connected to the connection node N0, and the drain electrode of the T7 is electrically connected to the second electrode of the T0;

the gate electrode of T8 is electrically connected to the second scanning line S2, the source electrode of T8 is electrically connected to the data line D1, and the drain electrode of T8 is electrically connected to the first electrode of T0;

a first terminal of C is electrically connected to a gate electrode of T0, and a second terminal of C is electrically connected to the high voltage terminal;

the cathode of O1 is electrically connected to a low voltage terminal, and the low voltage terminal is used for providing a low voltage VSS.

In the pixel circuit shown in FIG. 19 according to at least one embodiment, the first light-emitting control line and the second light-emitting control line are the same light-emitting control line E0.

In the pixel circuit shown in FIG. 19 according to at least one embodiment, T4 is an oxide thin-film transistor, and the other transistors may be, but are not limited to, low temperature polysilicon thin-film transistors.

In FIG. 19, the reference numeral N1 denotes a first node, the reference numeral N2 denotes a second node, and the reference numeral N3 denotes a third node; the first node N1 is electrically connected to the gate electrode of T0, the second node N2 is electrically connected to the source electrode of T0, and the third node N3 is electrically connected to the second electrode of T0.

In the pixel circuit shown in FIG. 19 according to at least one embodiment, the reset voltage provided by the DR may be a low voltage signal, but the present disclosure is not limited thereto. For example, the reset voltage may be Vi1, Vi2, or VSS.

Figure 20:
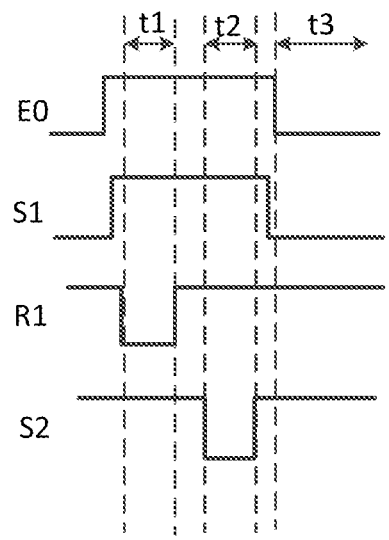
FIG. 20 is an operation timing diagram of the pixel circuit shown in FIG. 19 according to at least one embodiment.

As shown in FIG. 20, in operation of the pixel circuit shown in FIG. 19 according to at least one embodiment of the present disclosure, a display cycle includes an initialization phase t1, a data writing phase t2 and a light-emitting phase t3 which are arranged successively;

in the initialization phase t1, E0 provides a high voltage signal, S1 provides a high voltage signal, R1 provides a low voltage signal, S2 provides a high voltage signal, T6, T4 and T1 are all on, Vi1 is written to N1, meanwhile a low voltage signal is written to N3, and T0 is in an off-bias state;

in the data writing phase t2, E0 provides a high voltage signal, S1 provides a high voltage signal, R1 provides a high voltage signal, S2 provides a low voltage signal, T7, T8 and T4 are on, and a data voltage Vdata on D1 is written to N2; T5 turns on to write Vi2 to the anode of O1, so that O1 does not emit light and residual charges at the anode of O1 are removed;

at the beginning of the data writing phase t2, T0 turns on to charge C with Vdata, so that the potential at N1 is changed until the potential at N1 becomes Vdata+Vth, then T0 turns off;

in the light-emitting phase t3, E0 provides a low voltage signal, S1 provides a low voltage signal, S2 provides a high voltage signal, R1 provides a high voltage signal, T2. T0 and T3 are on, and T0 drives O1 to emit light.

When the pixel circuit shown in FIG. 19 according to at least one embodiment of the present disclosure operates, during the initialization phase t1, T0 is in the off state to ensure that each pixel circuit is charged and compensated starting from the off-bias state, without being affected by the data voltage of the previous frame, thereby eliminating the effect of hysteresis of T0 and improving the image retention and response time.

Figure 21:
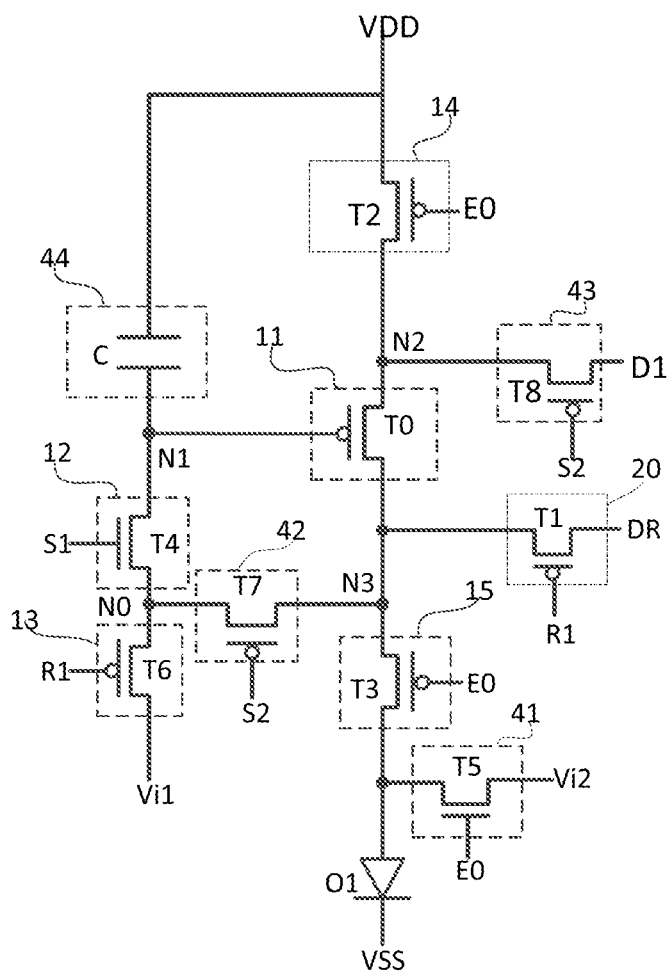
FIG. 21 is a circuit diagram of a pixel circuit according to at least one embodiment of the present disclosure.

As shown in FIG. 21, on the basis of the pixel circuit shown in FIG. 6 according to at least one embodiment, the reset circuit 20 includes a first transistor T1; the first light-emitting control circuit 14 includes a second transistor T2, and the second light-emitting control circuit 15 includes a third transistor T3; the control circuit 12 includes a fourth transistor T4; the second initialization circuit 41 includes a fifth transistor T5; the first initialization circuit 13 includes a sixth transistor T6, the compensation control circuit 42 includes a seventh transistor T7, the data writing circuit 43 includes an eighth transistor T8, the drive circuit 11 includes a drive transistor T0, and the energy storage circuit 44 includes a storage capacitor C; the light-emitting element is an organic light-emitting diode O1;

the gate electrode of T1 is electrically connected to the reset control line R1, the source electrode of T1 is electrically connected to the reset voltage line DR, and the drain electrode of T1 is electrically connected to the second electrode of T0; the reset voltage line DR is used for providing a reset voltage;

the gate electrode of T2 is electrically connected to the light-emitting control line E0, the source electrode of T2 is electrically connected to the high voltage terminal, and the drain electrode of T2 is electrically connected to the first electrode of T0; the high voltage terminal is used for providing a high voltage VDD;

the gate electrode of T3 is electrically connected to the light-emitting control line E0, the source electrode of T3 is electrically connected to the second electrode of T0, and the drain electrode of T3 is electrically connected to the anode of O1;

the gate electrode of T4 is electrically connected to the first scanning line S1, the source electrode of T4 is electrically connected to the gate electrode of T0, and the drain electrode of T4 is electrically connected to the connection node N0;

the gate electrode of T5 is electrically connected to the light-emitting control line E0, the source electrode of T5 is electrically connected to the second initial voltage line, and the drain electrode of T5 is electrically connected to the anode of O1; the second initial voltage line is used for providing a second initial voltage Vi2;

the gate electrode of T6 is electrically connected to the reset control line R1, the source electrode of T6 is electrically connected to the first initial voltage line, and the drain electrode of T6 is electrically connected to the connection node N0; the first initial voltage line is used for providing a first initial voltage Vi1;

the gate electrode of the T7 is electrically connected to the second scanning line S2, the source electrode of the T7 is electrically connected to the connection node N0, and the drain electrode of the T7 is electrically connected to the second electrode of the T0;

the gate electrode of T8 is electrically connected to the second scanning line S2, the source electrode of T8 is electrically connected to the data line D1, and the drain electrode of T8 is electrically connected to the first electrode of T0;

a first terminal of C is electrically connected to a gate electrode of T0, and a second terminal of C is electrically connected to the high voltage terminal;

the cathode of O1 is electrically connected to a low voltage terminal, and the low voltage terminal is used for providing a low voltage VSS.

In the pixel circuit shown in FIG. 21 according to at least one embodiment, the first light-emitting control line and the second light-emitting control line are the same light-emitting control line E0.

In the pixel circuit shown in FIG. 21 according to at least one embodiment, T4 and T5 are oxide thin-film transistors, and the other transistors may be, but are not limited to, low temperature polysilicon thin-film transistors.

In FIG. 21, the reference numeral N1 denotes a first node, the reference numeral N2 denotes a second node, and reference numeral N3 denotes a third node; the first node N1 is electrically connected to the gate electrode of T0, the second node N2 is electrically connected to the first electrode of T0, and the third node N3 is electrically connected to the second electrode of T0.

In the pixel circuit shown in FIG. 21 according to at least one embodiment, the reset voltage provided by the DR may be a low voltage signal, but the present disclosure is not limited thereto. For example, the reset voltage may be Vi1, Vi2, or VSS.

The pixel circuit shown in FIG. 21 according to at least one embodiment differs from the pixel circuit shown in FIG. 17 according to at least one embodiment only in that; T5 is an oxide thin-film transistor, and a gate electrode of T5 is electrically connected to a light-emitting control line E0; when E0 provides a high voltage signal, T5 turns on to reset the potential at the anode of O1. Generally, in order to solve the flicker problem, a high-frequency control signal is required to reset the potential at the anode of O1, and the second light-emitting control signal provided by E2 is a high-frequency signal itself, so that the problem of increased power consumption caused by converting the signal controlling the gate electrode of T5 to a high-frequency signal can be eliminated.

Figure 22:
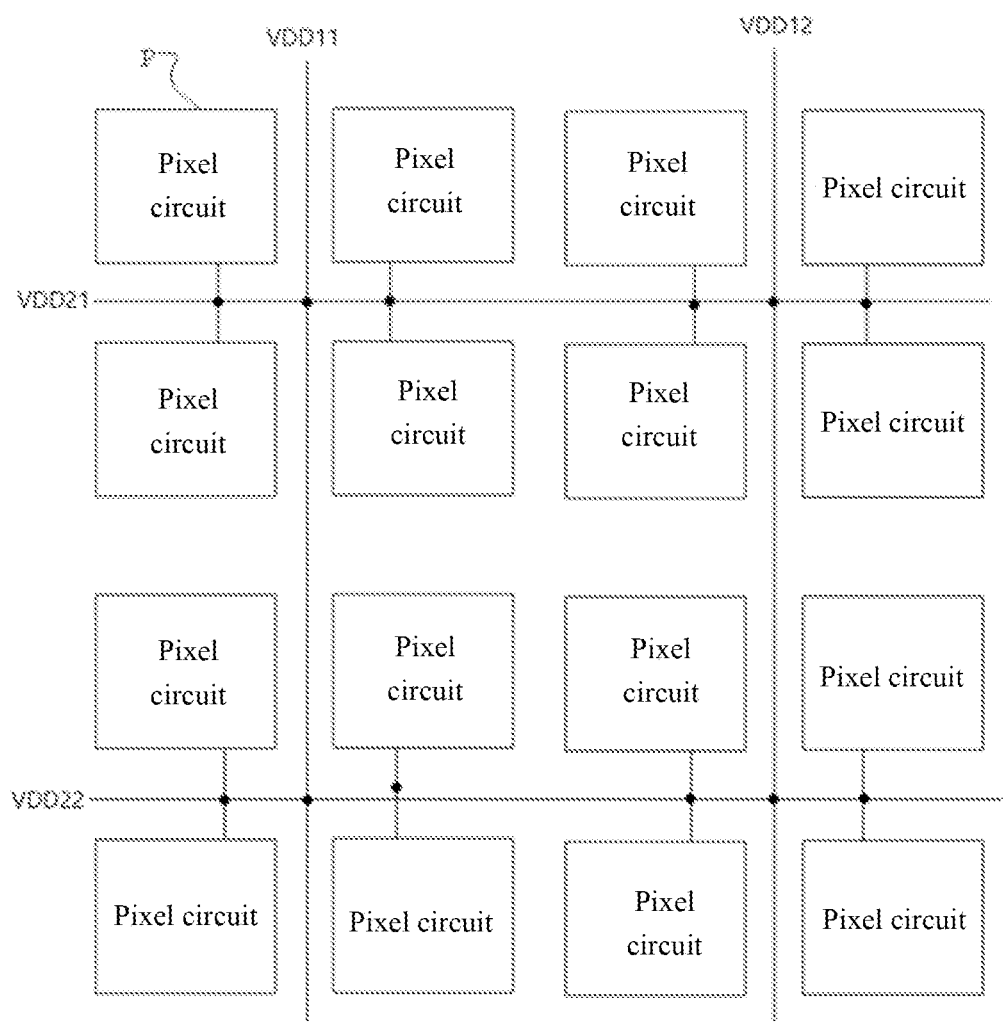
FIG. 22 is a distribution diagram of pixel circuits in a display device according to at least one embodiment of the present disclosure.

As shown in FIG. 22, a layout of pixel circuits in a display device according to at least one embodiment of the present disclosure is shown. The display device may include a plurality of pixel circuits P arranged in an array, a first high voltage line VDD11, a second high voltage line VDD12, a third high voltage line VDD21, and a fourth high voltage line VDD22, VDD11, VDD12, VDD21, VDD22 may all be used for providing a high voltage. As shown in FIG. 22, the VDD11 and the VDD12 extend in the column direction, the VDD21 and the VDD22 extend in the row direction, two adjacent rows of pixel circuits can be connected to a high voltage line extending in the same row direction, the high voltage line can be located between the two adjacent rows of pixel circuits, and the high voltage line extending in the column direction can be connected to multiple high voltage lines extending in the row direction which intersect therewith, so that the plurality of high voltage lines can form a grid structure. Here, the high voltage line extending in the column direction may be located in a region where the red pixel drive circuit is located. In addition, in the same pixel row, two pixel circuits belongs to adjacent columns may be arranged in a mirrored manner to facilitate wiring.

The driving method according to at least one embodiment of the present disclosure is applied to the above-mentioned pixel circuit, and the display cycle includes an initialization phase; the driving method includes:

in the initialization phase, a first initialization circuit writes a first initial voltage to a connection node under the control of a reset control signal, and a control circuit causes a control terminal of a drive circuit to be electrically connected to the connection node under the control of the first scanning signal, so as to write the first initial voltage to the control terminal of the drive circuit and control a drive transistor in the drive circuit to be in a predetermined bias state at the end of the initialization phase.

Optionally, the predetermined bias state may be an on-bias state or an off-bias state.

In the driving method according to at least one embodiment of the present disclosure, before the data voltage is written to the first terminal of the drive circuit, in an initialization phase, the control circuit and the first initialization circuit cooperate to write a first initial voltage to the control terminal of the drive circuit, and control the drive transistor in the drive circuit to be in a predetermined bias state at the end of the initialization phase, to improve the hysteresis of the drive transistor.

In at least one embodiment of the present disclosure, the predetermined bias state may be an off-bias state, and the driving method may further include:

in the initialization phase, a second light-emitting control circuit causes a second terminal of the drive circuit to be conductively connected to a first electrode of the light-emitting element under the control of a second light-emitting control signal;

at the start of the initialization phase, the drive circuit, under the control of the potential at the control terminal of the drive circuit, causes the first terminal of the drive circuit to be conductively connected to the second terminal of the drive circuit, to vary the potential at the first terminal of the drive circuit until a drive transistor included in the drive circuit turns off and the drive transistor is in an off-bias state.

In a driving method according to at least one embodiment of the present disclosure, before a data voltage is written to a first terminal of a drive circuit, in an initialization phase, a control circuit and the first initialization circuit cooperate to write a first initial voltage to a control terminal of the drive circuit, and the second light-emitting control circuit initializes a potential at a source electrode of a drive transistor included in the drive circuit, so that at the end of the initialization phase, the drive transistor is in an off-bias state, ensuring that the drive transistor in each pixel circuit is charged and compensated starting from the off-bias state, without being affected by the data voltage of the previous frame; so as to improve the effect of hysteresis of the drive transistor.

In at least one embodiment of the present disclosure, the predetermined bias state may be an on-bias state, and the driving method may further include:

in the initialization phase, the first light-emitting control circuit, under the control of the first light-emitting control signal, causes the first terminal of the drive circuit to be conductively connected to the first voltage terminal, such that the drive transistor in the drive circuit is in an on-bias state.

In a driving method according to at least one embodiment of the present disclosure, before a data voltage is written to a first terminal of a drive circuit, in an initialization phase, a control circuit cooperates with the first initialization circuit to write a first initial voltage to a control terminal of the drive circuit, and the first light-emitting control circuit causes the first terminal of the drive circuit to be conductively connected to the first voltage terminal, so that a drive transistor in the drive circuit is in an on-state bias state, ensuring that the drive transistor in each pixel circuit is charged and compensated starting from the on-state bias state without being affected by the data voltage of the previous frame; so as to ameliorate the hysteresis of the drive transistor.

Optionally, the pixel circuit further includes a data writing circuit, and the display cycle further includes a data writing phase following the initialization phase; the driving method further includes:

in the data writing phase, the data writing circuit writes a data voltage on the data line to the first terminal of the drive circuit under the control of the second scanning line.

Optionally, the pixel circuit further includes a second initialization circuit; the driving method further includes:

the second initialization circuit writes a second initial voltage to the first electrode of the light-emitting element under the control of an initial control signal, to control the light-emitting element not to emit light, and remove residual charges at the first electrode of the light-emitting element.

A driving method according to at least one embodiment of the present disclosure is applied to the above-mentioned pixel circuit, the pixel circuit further including a reset circuit; the first light-emitting control line and the second light-emitting control line are the same light-emitting control line; the display cycle includes an initialization phase; the driving method includes:

in the initialization phase, the first initialization circuit writes a first initial voltage to a connection node under the control of a reset control signal, and a control circuit causes a control terminal of a drive circuit to be electrically connected to the connection node under the control of a first scanning signal so as to write a first initial voltage to the control terminal of the drive circuit; the reset circuit initializes the potential at a first terminal of the drive circuit or the potential at a second terminal of the drive circuit under the control of a reset control signal.

In the driving method according to an embodiment of the present disclosure, before the data voltage is written to the first terminal of the drive circuit, in an initialization phase, the control circuit and the first initialization circuit cooperate to write the first initial voltage to the control terminal of the drive circuit, and the reset circuit initializes the potential at the first terminal of the drive circuit or the potential at the second terminal of the drive circuit under the control of the reset control signal, so that the hysteresis of the drive transistor can be ameliorated.

Optionally, the pixel circuit further includes a data writing circuit, and the display cycle further includes a data writing phase following the initialization phase; the driving method further includes:

in the data writing phase, the data writing circuit writes a data voltage on the data line to the first terminal of the drive circuit under the control of the second scanning line.

Optionally, the pixel circuit further includes a second initialization circuit; the driving method further includes:

the second initialization circuit writes a second initial voltage to the first electrode of the light-emitting element under the control of an initial control signal, to control the light-emitting element not to emit light, and remove residual charges at the first electrode of the light-emitting element.

A display device according to an embodiment of the present disclosure includes the above-described pixel circuit.

The display device according to embodiments of the present disclosure may be a mobile phone, a tablet computer, a television, a display, a notebook computer, a digital photo frame, a navigator, or any product or component with a display function.

While the foregoing is directed to the optional embodiments of the present disclosure, it will be understood by those skilled in the art that numerous modifications and adaptations may be made without departing from the principles of the disclosure, and such modifications and adaptations should also be deemed as falling within the scope of the disclosure.

What is claimed is:

1. A pixel circuit, comprising: a light-emitting element, a drive circuit, a control circuit, a first initialization circuit, a first light-emitting control circuit and a second light-emitting control circuit, wherein the control circuit is electrically connected to a first scanning line, a control terminal of the drive circuit and a connection node, and is used for causing, under the control of a first scanning signal provided by the first scanning line, the control terminal of the drive circuit to be electrically connected to the connection node;

the first initialization circuit is electrically connected to a reset control line, the connection node and a first initial voltage line, and is used for writing, under the control of a reset control signal provided by the reset control line, a first initial voltage provided by the first initial voltage line to the connection node;

the first light-emitting control circuit is electrically connected to a first light-emitting control line, a first voltage terminal and a first terminal of the drive circuit, and is used for causing, under the control of a first light-emitting control signal provided by the first light-emitting control line, the first voltage terminal to be conductively connected to the first terminal of the drive circuit;

the second light-emitting control circuit is electrically connected to a second light-emitting control line, a second terminal of the drive circuit and a first electrode of the light-emitting element, and is used for causing, under the control of a second light-emitting control signal provided by the second light-emitting control line, the second terminal of the drive circuit to be conductively connected to the first electrode of the light-emitting element;

the drive circuit is used for causing, under the control of a potential at the control terminal of the drive circuit, the first terminal of the drive circuit to be conductively connected to the second terminal of the drive circuit;

wherein the pixel circuit further comprises a reset circuit;

wherein the reset circuit is electrically connected to the reset control line and the first terminal of the drive circuit, and is used for initializing a potential of the first terminal of the drive circuit under the control of the reset control signal; or, the reset circuit is electrically connected to the reset control line and the second terminal of the drive circuit, and is used for initializing a potential of the second terminal of the drive circuit under the control of the reset control signal;

wherein the reset circuit comprises a first transistor;

a control electrode of the first transistor and a first electrode of the first transistor are electrically connected to the reset control line, and a second electrode of the first transistor is electrically connected to the first terminal of the drive circuit or the second terminal of the drive circuit.

2. The pixel circuit according to claim 1, wherein the first light-emitting control circuit comprises a second transistor, and the second light-emitting control circuit comprises a third transistor;

a control electrode of the second transistor is electrically connected to the first light-emitting control line, a first electrode of the second transistor is electrically connected to the first voltage terminal, and a second electrode of the second transistor is electrically connected to the first terminal of the drive circuit;

a control electrode of the third transistor is electrically connected to the second light-emitting control line, a first electrode of the third transistor is electrically connected to the second terminal of the drive circuit, and a second electrode of the third transistor is electrically connected to the first electrode of the light-emitting element.

3. The pixel circuit according to claim 1, wherein the first light-emitting control line and the second light-emitting control line are different light-emitting control lines; or, the first light-emitting control line and the second light-emitting control line are the same light-emitting control line.

4. The pixel circuit according to claim 1, wherein the control circuit comprises a fourth transistor;

a control electrode of the fourth transistor is electrically connected to the first scanning line, a first electrode of the fourth transistor is electrically connected to the control terminal of the drive circuit, and a second electrode of the fourth transistor is electrically connected to the connection node;

the fourth transistor is an oxide thin-film transistor.

5. The pixel circuit according to claim 1, further comprising a second initialization circuit; wherein the second initialization circuit is electrically connected to an initial control line, a second initial voltage line and the first electrode of the light-emitting element, and is used for writing, under the control of an initial control signal provided by the initial control line, a second initial voltage provided by the second initial voltage line to the first electrode of the light-emitting element.

6. The pixel circuit according to claim 5, wherein the second initialization circuit comprises a fifth transistor;

a control electrode of the fifth transistor is electrically connected to the initial control line, a first electrode of the fifth transistor is electrically connected to the second initial voltage line, and a second electrode of the fifth transistor is electrically connected to the first electrode of the light-emitting element;

the fifth transistor is an oxide thin-film transistor; the initial control line is the first light-emitting control line or the second light-emitting control line.

7. The pixel circuit according to claim 1, further comprising a compensation control circuit, a data writing circuit and an energy storage circuit; wherein the compensation control circuit is electrically connected to a second scanning line, the connection node and the second terminal of the drive circuit, and is used for causing, under the control of a second scanning signal provided by the second scanning line, the connection node to be conductively connected to the second terminal of the drive circuit;

the data writing circuit is electrically connected to the second scanning line, a data line and the first terminal of the drive circuit, and is used for writing, under the control of the second scanning signal, a data voltage on the data line to the first terminal of the drive circuit;

the energy storage circuit is electrically connected to the control terminal of the drive circuit, and is used for storing electric energy.

8. The pixel circuit according to claim 7, wherein the first initialization circuit comprises a sixth transistor, the compensation control circuit comprises a seventh transistor, the data writing circuit comprises an eighth transistor, the drive circuit comprises a drive transistor, and the energy storage circuit comprises a storage capacitor;

a control electrode of the sixth transistor is electrically connected to the reset control line, a first electrode of the sixth transistor is electrically connected to the first initial voltage line, and a second electrode of the sixth transistor is electrically connected to the connection node;

a control electrode of the seventh transistor is electrically connected to the second scanning line, a first electrode of the seventh transistor is electrically connected to the connection node, and a second electrode of the seventh transistor is electrically connected to a second electrode of the drive transistor;

a control electrode of the eighth transistor is electrically connected to the second scanning line, a first electrode of the eighth transistor is electrically connected to the data line, and a second electrode of the eighth transistor is electrically connected to a first electrode of the drive transistor;

a first terminal of the storage capacitor is electrically connected to a control electrode of the drive transistor, and a second terminal of the storage capacitor is electrically connected to the first voltage terminal.

9. A driving method applied to a pixel circuit, wherein the pixel circuit comprises: a light-emitting element, a drive circuit, a control circuit, a first initialization circuit, a first light-emitting control circuit and a second light-emitting control circuit, wherein the control circuit is electrically connected to a first scanning line, a control terminal of the drive circuit and a connection node, and is used for causing, under the control of a first scanning signal provided by the first scanning line, the control terminal of the drive circuit to be electrically connected to the connection node;

the first initialization circuit is electrically connected to a reset control line, the connection node and a first initial voltage line, and is used for writing, under the control of a reset control signal provided by the reset control line, a first initial voltage provided by the first initial voltage line to the connection node;

the first light-emitting control circuit is electrically connected to a first light-emitting control line, a first voltage terminal and a first terminal of the drive circuit, and is used for causing, under the control of a first light-emitting control signal provided by the first light-emitting control line, the first voltage terminal to be conductively connected to the first terminal of the drive circuit;

the second light-emitting control circuit is electrically connected to a second light-emitting control line, a second terminal of the drive circuit and a first electrode of the light-emitting element, and is used for causing, under the control of a second light-emitting control signal provided by the second light-emitting control line, the second terminal of the drive circuit to be conductively connected to the first electrode of the light-emitting element;

the drive circuit is used for causing, under the control of a potential at the control terminal of the drive circuit, the first terminal of the drive circuit to be conductively connected to the second terminal of the drive circuit;

wherein the pixel circuit further comprises a reset circuit;

wherein the reset circuit is electrically connected to the reset control line and the first terminal of the drive circuit, and is used for initializing a potential of the first terminal of the drive circuit under the control of the reset control signal; or, the reset circuit is electrically connected to the reset control line and the second terminal of the drive circuit, and is used for initializing a potential of the second terminal of the drive circuit under the control of the reset control signal;

wherein the reset circuit comprises a first transistor;

a control electrode of the first transistor and a first electrode of the first transistor are electrically connected to the reset control line, and a second electrode of the first transistor is electrically connected to the first terminal of the drive circuit or the second terminal of the drive circuit;

wherein a display cycle comprises an initialization phase; the driving method comprises:

in the initialization phase, writing, by the first initialization circuit under the control of the reset control signal, the first initial voltage to the connection node, and causing, by the control circuit under the control of the first scanning signal, the control terminal of the drive circuit to be electrically connected to the connection node, so as to write the first initial voltage to the control terminal of the drive circuit and cause the drive transistor in the drive circuit to be in a predetermined bias state at the end of the initialization phase.

10. The driving method according to claim 9, wherein the predetermined bias state is an off-bias state; the driving method further comprises:

in the initialization phase, causing, by the second light-emitting control circuit under the control of the second light-emitting control signal, the second terminal of the drive circuit to be conductively connected to the first electrode of the light-emitting element;

at the start of the initialization phase, causing, by the drive circuit under the control of a potential at the control terminal of the drive circuit, the first terminal of the drive circuit to be conductively connected to the second terminal of the drive circuit, to vary a potential at the first terminal of the drive circuit until the drive transistor comprised in the drive circuit turns off, and the drive transistor is in an off-bias state.

11. The driving method according to claim 9, wherein the predetermined bias state is an on-bias state; the driving method further comprises:

in the initialization phase, causing, by the first light-emitting control circuit under the control of the first light-emitting control signal, the first terminal of the drive circuit to be conductively connected to the first voltage terminal, such that the drive transistor in the drive circuit is in an on-bias state.

12. The driving method according to claim 10, wherein the pixel circuit further comprises a data writing circuit, and the display cycle further comprises a data writing phase following the initialization phase; the driving method further comprises:

in the data writing phase, writing, by the data writing circuit under the control of a second scanning line, a data voltage on a data line to the first terminal of the drive circuit.

13. The driving method according to claim 10, wherein the pixel circuit further comprises a second initialization circuit; the driving method further comprises:

writing, by the second initialization circuit under the control of an initial control signal, a second initial voltage to the first electrode of the light-emitting element to control the light-emitting element not to emit light.

14. A driving method applied to a pixel circuit, wherein the pixel circuit comprises: a light-emitting element, a drive circuit, a control circuit, a first initialization circuit, a first light-emitting control circuit and a second light-emitting control circuit, wherein the control circuit is electrically connected to a first scanning line, a control terminal of the drive circuit and a connection node, and is used for causing, under the control of a first scanning signal provided by the first scanning line, the control terminal of the drive circuit to be electrically connected to the connection node;

the first initialization circuit is electrically connected to a reset control line, the connection node and a first initial voltage line, and is used for writing, under the control of a reset control signal provided by the reset control line, a first initial voltage provided by the first initial voltage line to the connection node;

the first light-emitting control circuit is electrically connected to a first light-emitting control line, a first voltage terminal and a first terminal of the drive circuit, and is used for causing, under the control of a first light-emitting control signal provided by the first light-emitting control line, the first voltage terminal to be conductively connected to the first terminal of the drive circuit;

the second light-emitting control circuit is electrically connected to a second light-emitting control line, a second terminal of the drive circuit and a first electrode of the light-emitting element, and is used for causing, under the control of a second light-emitting control signal provided by the second light-emitting control line, the second terminal of the drive circuit to be conductively connected to the first electrode of the light-emitting element;

the drive circuit is used for causing, under the control of a potential at the control terminal of the drive circuit, the first terminal of the drive circuit to be conductively connected to the second terminal of the drive circuit;

wherein the pixel circuit further comprises a reset circuit;

wherein the reset circuit is electrically connected to the reset control line and the first terminal of the drive circuit, and is used for initializing a potential of the first terminal of the drive circuit under the control of the reset control signal; or, the reset circuit is electrically connected to the reset control line and the second terminal of the drive circuit, and is used for initializing a potential of the second terminal of the drive circuit under the control of the reset control signal;

wherein the reset circuit comprises a first transistor;

a control electrode of the first transistor and a first electrode of the first transistor are electrically connected to the reset control line, and a second electrode of the first transistor is electrically connected to the first terminal of the drive circuit or the second terminal of the drive circuit;

wherein the first light-emitting control line and the second light-emitting control line are the same light-emitting control line; the display cycle comprises an initialization phase;

the driving method comprises:

in the initialization phase, writing, by the first initialization circuit under the control of the reset control signal, the first initial voltage to the connection node, and causing, by the control circuit under the control of the first scanning signal, the control terminal of the drive circuit to be electrically connected to the connection node so as to write the first initial voltage to the control terminal of the drive circuit; and initializing, by the reset circuit under the control of the reset control signal, the potential of the first terminal of the drive circuit or the potential of the second terminal of the drive circuit.

15. The driving method according to claim 14, wherein the pixel circuit further comprises a data writing circuit, and the display cycle further comprises a data writing phase following the initialization phase; the driving method further comprises:

in the data writing phase, writing, by the data writing circuit under the control of a second scanning line, a data voltage on a data line to the first terminal of the drive circuit.

16. The driving method according to claim 14, wherein the pixel circuit further comprises a second initialization circuit; the driving method further comprises:

writing, by the second initialization circuit under the control of an initial control signal, a second initial voltage to the first electrode of the light-emitting element to control the light-emitting element not to emit light.

17. A display device comprising the pixel circuit according to claim 1.

* * * * *